(12) United States Patent
Chen et al.

(10) Patent No.: US 12,267,090 B2
(45) Date of Patent: Apr. 1, 2025

(54) INTERMEDIATE FREQUENCY FILTER FOR MILLIMETER-WAVE CARRIER AGGREGATION

(71) Applicant: QUALCOMM Incorporated, San Diego, CA (US)

(72) Inventors: Wu-Hsin Chen, San Diego, CA (US); Yunfei Feng, San Diego, CA (US); Vinod Panikkath, San Diego, CA (US); Li Liu, San Diego, CA (US); Sher Jiun Fang, Allen, TX (US)

(73) Assignee: QUALCOMM Incorporated, San Diego, CA (US)

( * ) Notice: Subject to any disclaimer, the term of this patent is extended or adjusted under 35 U.S.C. 154(b) by 384 days.

(21) Appl. No.: 17/934,784

(22) Filed: Sep. 23, 2022

(65) Prior Publication Data

US 2024/0106463 A1    Mar. 28, 2024

(51) Int. Cl.
  *H04B 1/00*   (2006.01)
  *H03H 7/01*   (2006.01)
  *H04B 1/10*   (2006.01)

(52) U.S. Cl.
  CPC ......... *H04B 1/0057* (2013.01); *H03H 7/0115* (2013.01); *H03H 7/0153* (2013.01); *H03H 7/1766* (2013.01); *H04B 1/1036* (2013.01)

(58) Field of Classification Search
  CPC .. H04B 1/0057; H04B 1/1036; H03H 7/0115; H03H 7/0153; H03H 7/1766; H04L 2027/0016; H04L 2027/0024; H04L 2027/0055; H04L 5/001; H04L 27/0014
  See application file for complete search history.

(56) References Cited

U.S. PATENT DOCUMENTS

2017/0155362 A1*  6/2017  Selvanayagam ......... H04B 1/16
2022/0029645 A1*  1/2022  Saily ........................ H04B 1/30

FOREIGN PATENT DOCUMENTS

WO   2016175974 A1   11/2016
WO   2018226335 A1   12/2018

OTHER PUBLICATIONS

International Search Report and Written Opinion—PCT/US2023/074397—ISA/EPO—Jan. 15, 2024.

* cited by examiner

*Primary Examiner* — Dominic E Rego
(74) *Attorney, Agent, or Firm* — Polsinelli/Qualcomm Incorporated

(57) ABSTRACT

Aspects of the disclosure relate to wireless communication apparatuses, methods, and other aspects of sliding intermediate frequency filters for carrier aggregation communications. One aspect a high band mixer including a radio frequency (RF) receive signal input, a local oscillator (LO) input, and an IF signal output, a tunable high pass filter including an input and an output, an intermediate frequency (IF) received signal multiplexer including a merged IF CA signal output, a first input, and a second input, an LO input, and an IF signal output, where the RF receive signal input is coupled to the low band mmW CA receive port, and a tunable low pass filter including an input and an output, where the input is coupled to the IF signal output of the low band mixer, and where the output is coupled to the second input of the IF received signal multiplexer.

30 Claims, 14 Drawing Sheets

1400

1402
Means for downconverting a first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal

1404
Means for filtering the high band IF signal using a tunable high pass filter, the tunable high pass filter including an input and an output, wherein the input is coupled to the IF signal output of the high band mixer

1406
Means for downconverting the second wireless data signal to a low band IF signal using a low band mixer including an RF receive signal input, an LO input, and an IF signal output, wherein the RF receive signal input is coupled to the low band mmW CA receive port to receive the second wireless data signal

1408
Means for filtering the low band IF signal using a tunable low pass filter, the tunable low pass filter including an input and an output, wherein the input is coupled to the IF signal output of the low band mixer, and wherein the output is coupled to the second input of the IF received signal multiplexer

1410
Means for multiplexing the high band IF signal and the low band IF signal to generate a merged IF CA signal using an IF received signal multiplexer, the IF received signal multiplexer including a merged IF CA signal output, a first input, and a second input, wherein the first input is coupled to the output of the tunable high pass filter to receive the high band IF signal, and wherein the second input is coupled to the output of the tunable low pass filter to receive the low band IF signal

FIG. 14

INTERMEDIATE FREQUENCY FILTER FOR MILLIMETER-WAVE CARRIER AGGREGATION

FIELD

The present disclosure relates generally to electronics and wireless communications. For example, aspects of the present disclosure relate millimeter wave (mmW) communications and architectures for carrier aggregation (CA) in mmW receivers.

BACKGROUND

Wireless communication devices and technologies are becoming ever more prevalent. Wireless communication devices generally transmit and receive communication signals. A communication signal is typically processed by a variety of different components and circuits. In some modern communication systems, many different wavelengths of electromagnetic waves can be used in a single device and specialized transmit and receive configurations can be used to generate and received orthogonal signals in the same wireless paths. Providing consistent signals of sufficient quality to meeting communication performance targets in such environments can involve additional complexity in a wireless communication system.

SUMMARY

Various implementations of systems, methods and devices within the scope of the appended claims each have several aspects, no single one of which is solely responsible for the desirable attributes described herein. Without limiting the scope of the appended claims, some prominent features are described herein.

In some aspects, a wireless communication apparatus is provided. The wireless communication apparatus comprises a high band millimeter wave (mmW) carrier aggregation (CA) receive port; a high band mixer coupled to the high band mmW CA receive port; a tunable high pass filter coupled to the high band mixer; a low band mmW CA receive port; a low band mixer couple to the low band mmW CA receive port; a tunable low pass filter coupled to the low band mixer; and an intermediate frequency (IF) received signal multiplexer including a first input coupled to the tunable high pass filter, a second input coupled to the tunable low pass filter, and a merged IF CA signal output.

In another aspect, a method is provided. The method comprises receiving, at a high band millimeter wave (mmW) carrier aggregation (CA) receive port, a first wireless data signal; downconverting the first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal; filtering the high band IF signal using a tunable high pass filter, the tunable high pass filter including an input and an output, wherein the input is coupled to the IF signal output of the high band mixer; receiving a second wireless data signal at a low band mmW CA receive port; downconverting the second wireless data signal to a low band IF signal using a low band mixer including an RF receive signal input, an LO input, and an IF signal output, wherein the RF receive signal input is coupled to the low band mmW CA receive port to receive the second wireless data signal; filtering the low band IF signal using a tunable low pass filter, the tunable low pass filter including an input and an output, wherein the input is coupled to the IF signal output of the low band mixer, and wherein the output is coupled to the second input of the IF received signal multiplexer; and multiplexing the high band IF signal and the low band IF signal to generate a merged IF CA signal using an IF received signal multiplexer, the IF received signal multiplexer including a merged IF CA signal output, a first input, and a second input, wherein the first input is coupled to the output of the tunable high pass filter to receive the high band IF signal, and wherein the second input is coupled to the output of the tunable low pass filter to receive the low band IF signal.

In another aspect, another wireless communication apparatus is provided. The wireless communication apparatus comprises a high band millimeter wave (mmW) carrier aggregation (CA) receive port; a high band mixer including a radio frequency (RF) receive signal input, a local oscillator (LO) input, and an IF signal output, wherein the RF receive signal input is coupled to the high band mmW CA receive port; a tunable high pass filter including an input and an output, wherein the input is coupled to the IF signal output of the high band mixer; an intermediate frequency (IF) received signal multiplexer including a merged IF CA signal output, a first input, and a second input, wherein the first input is coupled to the output of the tunable high pass filter; a low band mmW CA receive port; a low band mixer including an RF receive signal input, an LO input, and an IF signal output, wherein the RF receive signal input is coupled to the low band mmW CA receive port; a tunable low pass filter including an input and an output, wherein the input is coupled to the IF signal output of the low band mixer, and wherein the output is coupled to the second input of the IF received signal multiplexer.

Some such aspects further comprise a mmW transmission path coupled to the output of the IF received signal multiplexer. Other aspects further comprise an IF integrated circuit; wherein the high band mixer, the tunable high pass filter, the IF received signal multiplexer, the low band mixer, and the tunable low pass filter are structured as part of an RF integrated circuit; and wherein the mmW transmission path couples the merged IF CA signal output of the IF received signal multiplexer to the IF integrated circuit.

Some such aspects further operate where the high band mmW CA receive port is configured to receive a first wireless data signal in a high band channel of a CA system; and wherein the low band mmW CA receive port is configured to receive a second wireless data signal in a low band channel of the CA system.

Some such aspects further operate where the high band mixer is configured to downconvert the first wireless data signal to a high band IF signal using an LO signal; wherein the low band mixer is configured to downconvert the second wireless data signal to a low band IF signal using the LO signal; and wherein the IF received signal multiplexer is configured to merge the low band IF signal and the high band IF signal into a merged IF CA signal for transmission to the IF integrated circuit via the mmW transmission path.

Some such aspects further operate with control circuitry coupled to the tunable high pass filter and the tunable low pass filter, wherein the control circuitry is configured to dynamically determine a low band frequency range associated with the low band channel and a high band frequency range associated with the high band channel, and dynamically adjust the tunable low pass filter and the tunable high pass filter based on the low band frequency range and the high band frequency range.

In other aspect, the control circuitry is coupled to the tunable high pass filter and the tunable low pass filter, wherein the control circuitry is configured to dynamically adjust the tunable low pass filter to suppress in-band blocking signals of the second wireless data signal that would interfere with the high band IF signal; and the control circuitry is configured to dynamically adjust the tunable high pass filter to suppress in-band blocking signals of the first wireless data signal that would interfere with the low band IF signal.

In some such aspects, the threshold signal suppression amount is 30 decibels (dB), and wherein the threshold frequency distance is 2 gigahertz (GHz). In other aspects, the end frequency of the low band channel is configurable from a frequency of 8.8 GHz to a frequency of 10 GHz. In other aspects, the end frequency of the high band channel is configurable from a frequency of 10.8 GHz to a frequency of 12 GHz. In some aspects, the end frequency of the high band channel of the CA system is configurable in a first range of frequencies, and wherein the end frequency of the low band channel of the CA system is configurable in a second range of frequencies, wherein the first range of frequencies overlaps with the second range of frequencies.

Some such aspects further comprise modem circuitry coupled to the IF integrated circuit, wherein the IF integrated circuit is configured to separate the low band IF signal and the high band IF signal from the merged IF CA signal and downconvert the low band IF signal and the high band IF signal to corresponding baseband frequencies for communication to the modem circuitry.

Some such aspects further comprise a first signal path and a second signal path for receiving corresponding wireless signals for beamforming; wherein the high band mmW CA receive port, the low band mmW CA receive port, the high band mixer, the tunable high pass filter, the IF received signal multiplexer, the low band mixer, and the tunable low pass filter are structured as part of the first signal path, and may operate where the second signal path includes: a second high band mmW CA receive port; a second high band mixer including an RF receive signal input, a local oscillator (LO) input, and an IF signal output, wherein the RF receive signal input is coupled to the second high band mmW CA receive port; a second tunable high pass filter including an input and an output, wherein the second input is coupled to the IF signal output of the second high band mixer; a second IF received signal multiplexer including a merged IF CA signal output, a first input, and a second input, wherein the first input is coupled to the output of the second tunable high pass filter; a second low band mmW CA receive port; a second low band mixer including an RF receive signal input, an LO input, and an IF signal output, wherein the RF receive signal input is coupled to the second low band mmW CA receive port; and a second tunable low pass filter including an input and an output, wherein the input is coupled to the IF signal output of the second low band mixer, and wherein the output is coupled to the second input of the second IF received signal multiplexer.

Some aspects further comprise a high band antenna coupled to the high band mmW CA receive port; a low band antenna coupled to the low band mmW CA receive port; control circuitry coupled to the tunable high pass filter and the tunable low pass filter; and a display coupled to the control circuitry.

The foregoing, together with other features and embodiments, will become more apparent upon referring to the following specification, claims, and accompanying drawings.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 14 illustrates aspects of a device for correcting OAM beam misalignment, according to aspects described herein.

DETAILED DESCRIPTION

Figure 1:
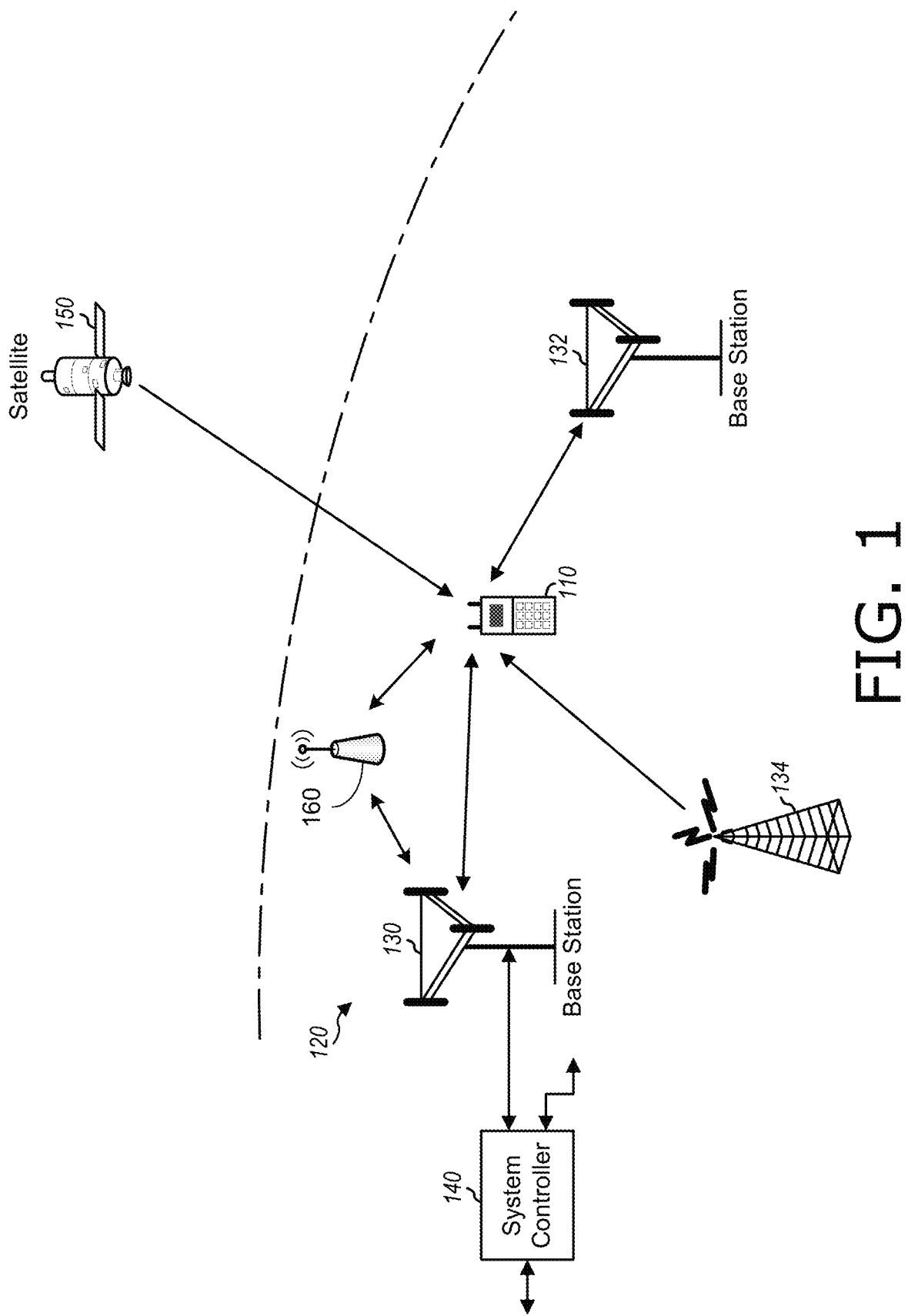
FIG. 1 is a diagram showing a wireless communication system including multiple devices that can be implemented with sliding intermediate frequency (IF) filters to improve millimeter wave (mmW) receivers (e.g., mmW carrier aggregation (CA) receivers), according to aspects described herein.

The detailed description set forth below in connection with the appended drawings is intended as a description of exemplary implementations and is not intended to represent the only implementations in which the invention may be practiced. The term "exemplary" used throughout the description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Cellular communication systems, such as Third Generation Partnership Project (3GPP) standardized communications, can use different frequencies (e.g., carriers) to communicate data between devices. The use of such multiple carrier or multiple frequency communications can be referred to as carrier aggregation (CA). In certain millimeter wave (mmW) receivers, the receiver path can be separated across multiple integrated circuits. In one such architecture, a radio frequency (RF) integrated circuit (RFIC) can be used to downconvert millimeter wave (mmW) wireless data signals to an intermediate frequency (IF), and the IF data signals that result from the downconversion can be transmitted to a different circuit (e.g., an IF IC), for further downconversion to a baseband signal.

In many implementations, coexistence of mmW cellular communications with lower frequency communication bands or other wireless technologies (e.g., ultra-wideband signals operating around 7.5-8.3 gigahertz (GHz)) result in an available frequency space for IF signals at relatively high frequencies (e.g., above 8.3 GHz). Paths to communicate an IF data signal between an RFIC and an IFIC at such frequencies can be costly in terms of space, power usage, signal quality, and component cost. Such costs are multiplied for CA communications with multiple IF data signals (e.g., one IF data signal for each carrier).

One possible solution to reduce such costs is to multiplex IF data signals into a merged IF CA signal which can communicate the IF signals from multiple CA channels using a single path between IC. Aspects described herein include sliding tunable filter circuits that can be used in multiplexing IF data signals in order to improve signal integrity and suppress out of band signals received with one carrier that are in band for the other channel in a merged IF CA signal. Such filters improve the operation of mmW receivers by reducing space and power usage relative to alternative designs, and by reducing an unused frequency gap space between IF signals when compared with receive circuitry without such tunable filters. Reduction of such an unused frequency gap allows greater spectral efficiency and improved communication system performance.

Various aspects of the application will be described with respect to the figures.

FIG. 1 is a diagram showing a communication system 120 that can include devices with tunable filters in mmW CA receivers, in accordance with aspects described herein. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. The communication system can include or be designed for coexistance with ultra-wideband (UWB) communications systems. For simplicity, FIG. 1 shows wireless communication system 120 including base stations 130 and 132, access point 160, and system controller 140. In general, a wireless communication system may include any number of base stations, and any set of other network entities, which may use OAM multiplexing communications in accordance with aspects described herein.

The wireless device 110 may also be referred to as a user equipment (UE), a mobile station, a terminal, an access terminal, a subscriber unit, a station, etc. Wireless device 110 may be a cellular phone, a smartphone, a tablet, or other such mobile device (e.g., a device integrated with a display screen). Other examples of the wireless device 110 include a wireless modem, a personal digital assistant (PDA), a handheld device, a laptop computer, a smartbook, a netbook, a tablet, a cordless phone, a medical device, a device configured to couple to one or more other devices (for example through the internet of things), a wireless access point (WAP) for providing a wireless area network using a WiFi front end and back-end wireless Internet access via a 3GPP cellular network, a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS), etc.). Wireless device 110 may support one or more radio technologies for wireless communication such as LTE, WCDMA, CDMA 1×, EVDO, TD-SCDMA, GSM, 802.11, 5G, etc.

Figure 2:
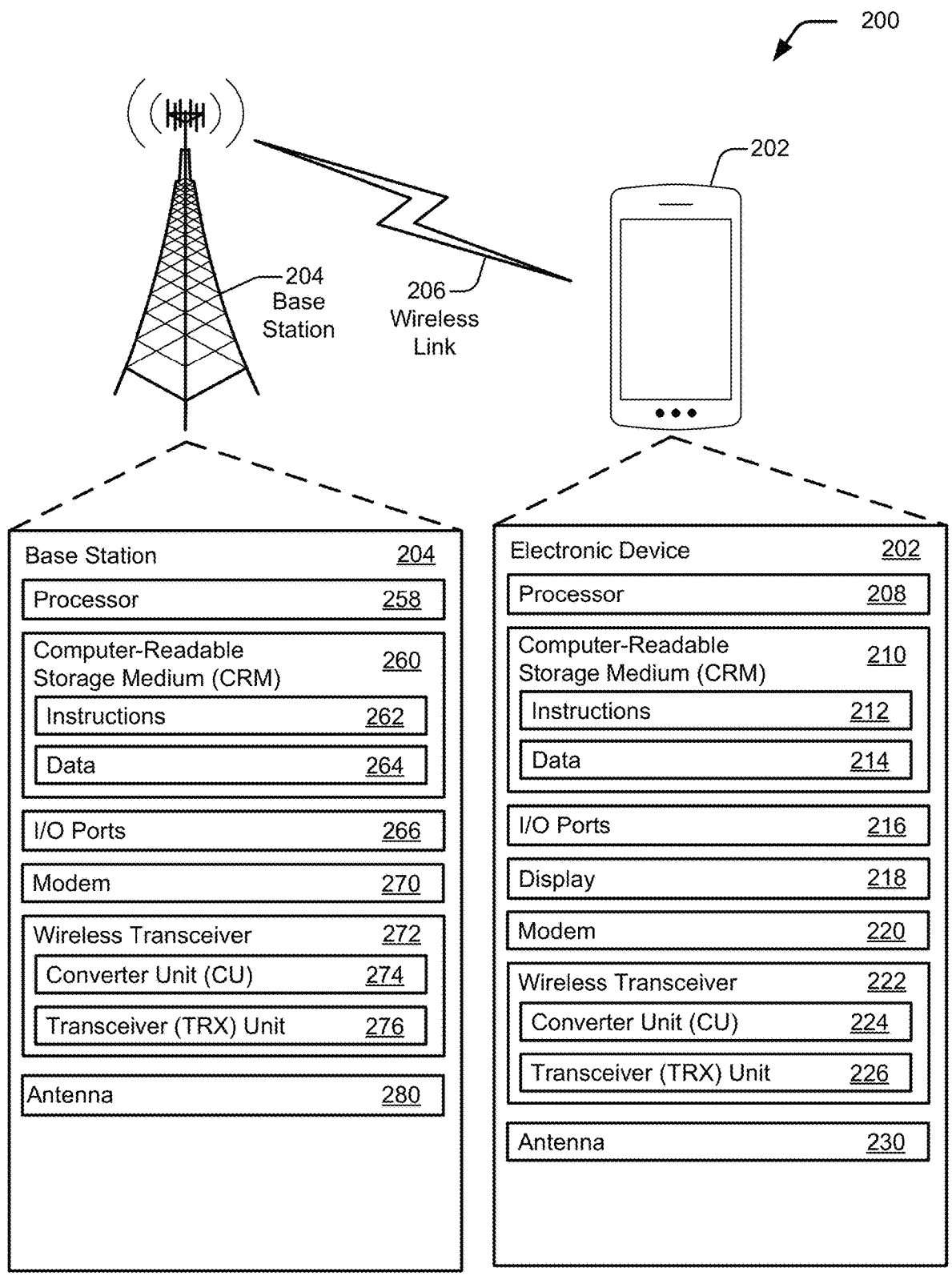
FIG. 2 is a diagram showing a wireless communication system including devices that can be implemented with sliding filters for mmW CA receivers, according to aspects described herein.

FIG. 2 is a diagram illustrating an environment 200 that includes an electronic device 202 and a base station 204. The environment 200 can be part of the system 120, the device 202 can be similar to the device 110, and the base station 204 can be similar to the base stations of FIG. 1. While a base station 204 and an electronic device 202 are described, in accordance with aspects described herein, similar wireless links 206 can apply between base stations. Such devices can be configured for mmW CA communications. When an additional device (not shown) is next to a transmitting device and the additional device is transmitting on an adjacent channel, a merged IF CA signal can include in band noise from the additional device. Aspects described herein can use tunable filters to suppress such in band noise while efficiently using the frequencies associated with the IF signals. In the example of FIG. 2, the electronic device 202 may be implemented as any suitable computing or other electronic device, such as a cellular base station, broadband router, access point, cellular or mobile phone, gaming device, navigation device, media device, laptop computer, desktop computer, tablet computer, server, WAP device, network-attached storage (NAS) device, smart appliance, vehicle-based communication system, Internet-of-Things (IoT) device, and so forth.

The base station 204 communicates with the electronic device 202 via the wireless link 206, which may be implemented as any suitable type of wireless link. Although depicted as a base station tower of a cellular radio network, the base station 204 may represent or be implemented as another device, such as a satellite, cable television head-end, terrestrial television broadcast tower, access point, peer-to-peer device, mesh network node, router, fiber optic line, another electronic device generally, and so forth. Hence, the electronic device 202 may communicate with the base station 204 or another device via a wired connection, a wireless connection, or a combination thereof.

The wireless link 206 can include a downlink of data or control information communicated from the base station 204 to the electronic device 202 and an uplink of other data or control information communicated from the electronic device 202 to the base station 204. The wireless link 206 may be implemented using any suitable communication protocol or standard, such as 3rd Generation Partnership Project Long-Term Evolution (3GPP LTE), 5G New Radio (3GPP 5GNR), IEEE 802.11, IEEE 802.16, Bluetooth™, and so forth.

The electronic device 202 includes a processor 208 and a computer-readable storage medium (CRM 210). The processor 208 may include any type of processor, such as an application processor or a multi-core processor, that is configured to execute processor-executable instructions (e.g., code) stored by the CRM 210. The CRM 210 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 210 is implemented to store instructions 212, data 214, and other information of the electronic device 202, and thus does not include transitory propagating signals or carrier waves.

The electronic device 202 may also include input/output ports 216 (I/O ports 216) or a display 218. The I/O ports 216 enable data exchanges or interaction with other devices, networks, or users. The I/O ports 216 may include serial ports (e.g., universal serial bus (USB) ports), parallel ports, audio ports, infrared (IR) ports, and so forth. The display 218 can be realized as a screen or projection that presents graphics, e.g.—one or more graphical images, of the electronic device 202, such as for a user interface associated with an operating system, program, or application. Alternatively, or additionally, the display 218 may be implemented as a display port or virtual interface through which graphical content of the electronic device 202 is communicated or presented.

For communication purposes, the electronic device 202 also includes a modem 220, a wireless transceiver 222, and at least one an antenna 230. The wireless transceiver 222 includes a converter unit (CU) 224 and a transceiver (TRX) unit 226. The wireless transceiver 222 provides connectivity to respective networks and other electronic devices connected therewith using RF wireless signals. Additionally, or alternatively, the electronic device 202 may include a wired transceiver, such as an Ethernet or fiber optic interface for communicating over a personal or local network, an intranet, or the Internet. The wireless transceiver 222 may facilitate communication over any suitable type of wireless network described herein.

The modem 220, such as a baseband modem, may be implemented as a system on-chip (SoC) that provides a digital communication interface for data, voice, messaging, and other applications of the electronic device 202. The modem 220 may also include baseband circuitry to perform high-rate sampling processes that can include analog-to-digital conversion (ADC), digital-to-analog conversion (DAC), gain correction, skew correction, frequency translation, and so forth. The modem 220 may also include logic to perform in-phase/quadrature (I/Q) operations, such as synthesis, encoding, modulation, demodulation, and decoding. More generally, the modem 220 may be realized as a digital signal processor (DSP) or a processor that is configured to perform signal processing to support communications via one or more networks. Alternatively, ADC or DAC operations may be performed by a separate component or another illustrated component, such as the wireless transceiver 222.

The wireless transceiver 222 can include circuitry, logic, and other hardware for transmitting or receiving a wireless signal for at least one communication frequency band. In operation, the wireless transceiver 222 can implement at least one radio-frequency transceiver unit to process data and/or signals associated with communicating data of the electronic device 202 via the antenna 230. Generally, the wireless transceiver 222 can include filters, switches, amplifiers, and so forth for routing and processing signals that are transmitted or received via the antenna 230. Generally, the wireless transceiver 222 includes multiple transceiver units (e.g., for different wireless protocols such as WLAN versus WWAN or for supporting different frequency bands or frequency band combinations).

Elements of the electronic device 202 are described above, and the base station 204 can have similar corresponding elements, in addition to any other elements that support base station functionality. The processors 258 can have similar structure and function as the processor 208, and computer readable media (CRM) 260 along with instructions 262 and data 264 can have similar structure and function as the CRM 210, the instructions 212, and the data 214. I/O ports 266 and modem 270 can have similar structure and function to the I/O ports 216 and the modem 220 above. A wireless transceiver 272 can include a converter unit 274 and a transceiver unit 276, as well as an antenna 280. The transceiver 272 can include 3GPP standard structures or other communication structures described above for base stations, along with implementations of wireless communication apparatuses with receivers including spur suppression in accordance with aspects described herein.

Figure 3:
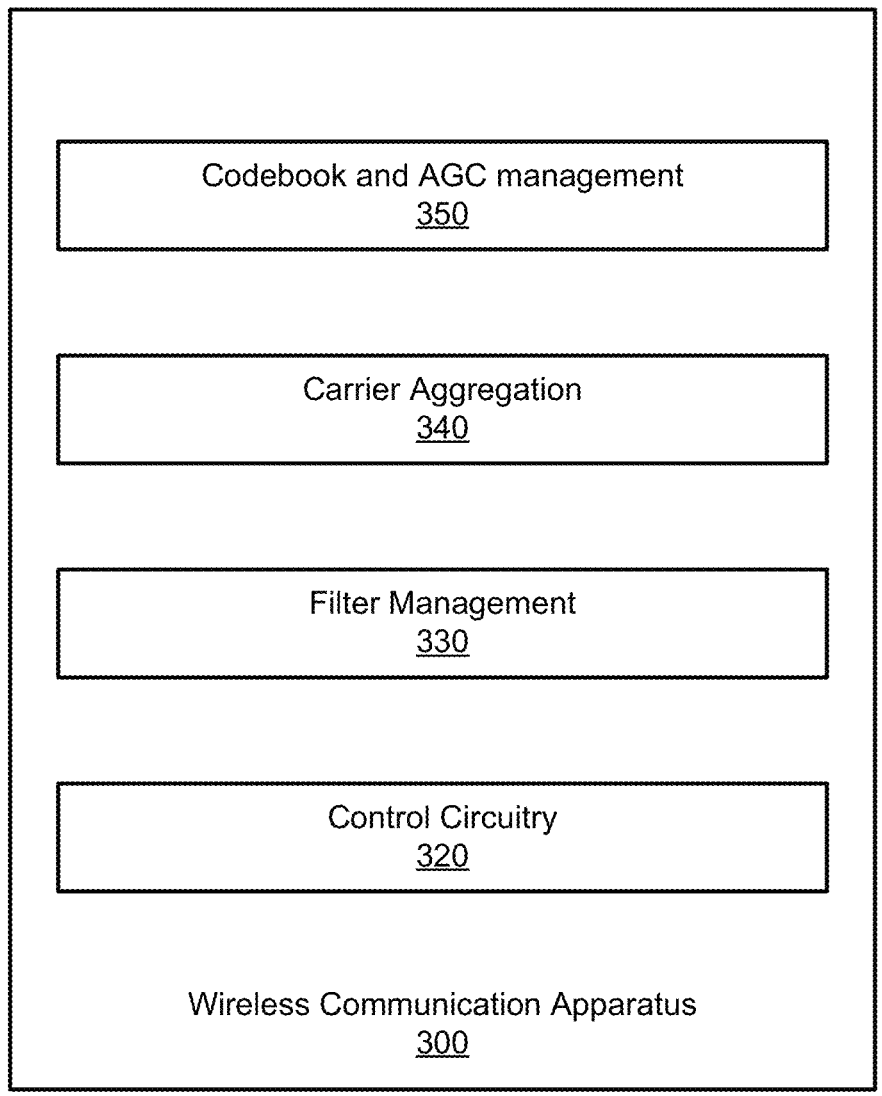
FIG. 3 is a block diagram illustrating aspects of a wireless communication apparatus with sliding filters for mmW CA receivers, according to aspects described herein.

FIG. 3 is a block diagram illustrating aspects of a wireless communication apparatus with tunable filters for mmW CA receivers in accordance with aspects described herein. FIG. 3 shows a wireless communication apparatus 300 including blocks that operate to provide spur suppression for mmW CA communications. The wireless communication apparatus 300 can be an element of any device or station (e.g., base stations 130, 132, 204 or electronic device 202), as part of wireless communication systems. As described above, mmW or higher frequency wireless communications can use CA for increased data throughput. For efficient processing of such signals, a receiver system can downconvert the different carrier signals separately, and then merge the downconverted signals into a single intermediate frequency signal that can be digitized and sent out to a modem as a single stream of data including the information from multiple carriers. Such an architecture can result in noise when another device is transmitting on an adjacent channel, such that the adjacent channel signal interferes with the IF signal from another CA channel when the signals are downconverted to IF frequencies. Aspects described herein include control circuitry and tunable filters that can be used in mmW CA receive path circuitry to suppress such in band noise signals.

To implement such spur suppression, as apparatus 300 includes a codebook and automatic gain control (AGC) management block 350, a carrier aggregation block 340, a filter management block 330, and control circuitry 320. Such an apparatus or other similar apparatuses can include other blocks, such as a MIMO block to support additional communications system to improve performance.

As mentioned above, a communication system using CA, along with other cellular communication technologies, can use multiple communication bandwidths and other technologies such as MIMO to increase communication performance. A codebook and automatic gain control (AGC) management block 350 includes available combinations of communication technologies, including available carriers for CA, and the power limits (e.g., AGC settings) for various combinations to comply with regulations and device operations. Different combinations of settings for CA operation and device settings (e.g., power settings) can be identified and communicated to other systems by block 350. Carrier aggregation block 340 can use the information from the codebook and AGC management block 350 to implement CA communication operations, and filter management block 330 can receive information about CA channels being used, and can manage selection of filter settings to match the CA channels in use. Additionally, tunable filters as described herein can be subject to process variation that can impact the filter performance. The filter management block 330 can perform testing on filter performance based on actual device characteristics as subject to process variation, and can adjust filter controls to match control inputs to the actual filter performance, instead of target design performance (e.g., that does not account for process variation). Once testing is performed, filter management block 330 can store results that match control signals from control circuitry to the filters, so that the CA channel frequencies are filtered based on the actual filter as fabricated, not as designed.

Control circuitry 320 can manage both the calibration process for the tunable filters as described above in conjunction with the filter management block 330, as well as communicating tuning control signals to tunable filters during device operations as described below.

Figure 4:
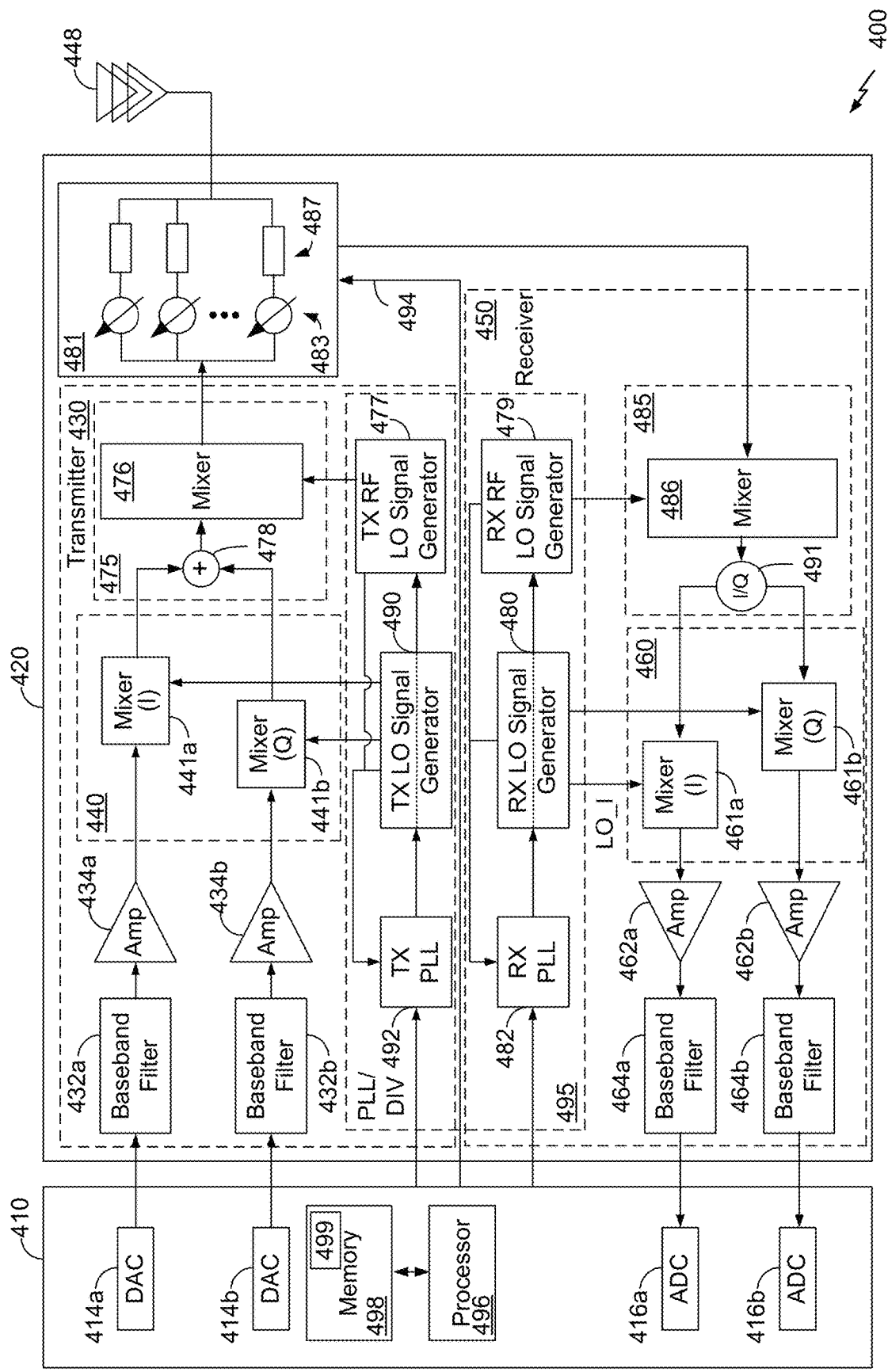
FIG. 4 illustrates aspects of a wireless communication apparatus that can be implemented with sliding filters in the receive signal path, according to aspects described herein.

FIG. 4 is a block diagram showing a wireless device 400 in which a mmW CA receiver in accordance with aspects described herein may be implemented. The wireless device 400 may, for example, be an embodiment of the wireless device 110 illustrated in FIG. 1. In some examples, the wireless device 400 (or any of the devices described and/or illustrated hereinafter) may be an example of any of the devices illustrated in FIG. 1.

FIG. 4 shows an example of a transceiver 420 including a transmitter 430 and a receiver 450. Transceiver 420 illustrates general aspects of a wireless communication device that can include a mmW CA receive path with a tunable filter and multiplexed IF signaling in accordance with aspects described herein. The conditioning of the signals in the transmitter 430 and the receiver 450 may be performed by one or more stages of amplifier, filter, upconverter, downconverter, etc. Additional details of a receive mmW CA path with tunable filtering are described in the additional figures below. In some aspects, a device may include additional communication circuitry for other frequencies, or duplicated elements described below for various communication systems. In some implementations, similar circuit blocks to those shown in FIG. 4 may be arranged differently from the configuration shown in FIG. 4. Furthermore, other circuit blocks not shown in FIG. 4 may also be used to condition the signals in the transmitter 430 and receiver 450. Unless otherwise noted, any signal in FIG. 4, or any other figure in the drawings, may be either single-ended or differential. Some circuit blocks in FIG. 4 may also be omitted.

In the example shown in FIG. 4, wireless device 400 generally comprises the transceiver 420 and a data processor 410. The data processor 410 may include a processor 496 operatively coupled to a memory 498. The memory 498 may be configured to store data and program codes shown generally using reference numeral 499, and may generally comprise analog and/or digital processing components. The processor 496 can be any control or computing circuitry. The transceiver 420 includes a transmitter 430 and a receiver 450 that support bi-directional communication. In general, wireless device 400 may include any number of transmitters and/or receivers for any number of communication systems and frequency bands. All or a portion of the transceiver 420 may be implemented on one or more analog integrated circuits (ICs), RF ICs (RFICs), intermediate frequency ICs (IFICs), mixed-signal ICs, etc.

In the transmit path, the data processor 410 processes data to be transmitted and provides in-phase (I) and quadrature (Q) analog output signals to the transmitter 430. In some aspects, the data processor 410 includes digital-to-analog-converters (DAC's) 414a and 414b for converting digital signals generated by the data processor 410 into the I and Q analog output signals, e.g., I and Q output currents, for further processing. In other embodiments, the DACs 414a and 414b are included in the transceiver 420 and the data processor 410 provides data (e.g., for I and Q) to the transceiver 420 digitally.

Within the transmitter 430, baseband (e.g., lowpass) filters 432a and 432b filter the I and Q analog transmit signals, respectively, to remove undesired images caused by the prior digital-to-analog conversion. Amplifiers (Amp) 434a and 434b amplify the signals from baseband filters 432a and 432b, respectively, and provide I and Q baseband signals. An upconverter 440 including upconversion mixers 441a and 441b upconverts the I and Q baseband signals with I and Q transmit (TX) local oscillator (LO) signals from a TX LO signal generator 490 and provides an upconverted signal. The received RF signal is amplified by LNA 452 and filtered by a filter to obtain a desired RF input signal. Downconversion mixers 461a and 461b in a downconverter 460 mix the output of filter with I and Q receive (RX) LO signals (i.e., LO I and LO Q) from an RX LO signal generator 480 to generate I and Q baseband signals. The I and Q baseband signals are amplified by amplifiers 462a and 462b and further filtered by baseband (e.g., lowpass) filters 464a and 464b to obtain I and Q analog input signals, which are provided to data processor 410. In the exemplary embodiment shown, the data processor 410 includes analog-to-digital-converters (ADC's) 416a and 416b for converting the analog input signals into digital signals to be further processed by the data processor 410. In some embodiments, the ADCs 416a and 416b are included in the transceiver 420 and provide data to the data processor 410 digitally.

In FIG. 4, TX LO signal generator 490 generates the I and Q TX LO signals used for frequency upconversion, while RX LO signal generator 480 generates the I and Q RX LO signals used for frequency downconversion. Each LO signal is a periodic signal with a particular fundamental frequency. A phase locked loop (PLL) 492 receives timing information from data processor 410 and generates a control signal used to adjust the frequency and/or phase of the TX LO signals from LO signal generator 490. Similarly, a PLL 482 receives timing information from data processor 410 and generates a control signal used to adjust the frequency and/or phase of the RX LO signals from LO signal generator 480.

In some aspects, the RX PLL 482, the TX PLL 492, the RX LO signal generator 480, and the TX LO signal generator 490 may alternatively be combined into a single LO generator circuit 495, which may include common or shared LO signal generator circuitry to provide the TX LO signals and the RX LO signals. Alternatively, separate LO generator circuits may be used to generate the TX LO signals and the RX LO signals.

Wireless device 400 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 420 are functionally illustrated in FIG. 4, and the configuration illustrated therein may or may not be representative of a physical device configuration in certain implementations. For example, as described above, transceiver 420 may be implemented in various integrated circuits (ICs), RF ICs (RFICs), mixed-signal ICs, etc. In some embodiments, the transceiver 420 is implemented on a substrate or board such as a printed circuit board (PCB) including various modules, chips, and/or components.

The wireless device 400 of FIG. 4 is an example of a heterodyne (or superheterodyne) architecture in which the upconverter 440 and the downconverter 460 are configured to process a communication signal between baseband and an intermediate frequency (IF). For example, the upconverter 440 may be configured to provide an IF signal to an upconverter 475. In some aspects, the upconverter 475 may comprise summing function 478 and upconversion mixer 476. The summing function 478 combines the I and the Q outputs of the upconverter 440 and provides a non-quadrature signal to the mixer 476. The non-quadrature signal may be single ended or differential. The mixer 476 is configured to receive the IF signal from the upconverter 440 and TX RF LO signals from a TX RF LO signal generator 477, and provide an upconverted RF signal to phase shift circuitry 481. The dashed line through the TX LO signal generator that continues from the output of the TX PLL 492, and the similar line through the RX LO signal generator indicates that the output of the TX PLL 492 can be used by both the TX LO signal generator 490 and the TX RF LO signal generator 477, and the output of the RX PLL 482 can be used by both the RX LO signal generator 480 and the RX RF LO signal generator 479. While PLL 492 is illustrated in FIG. 4 as being shared by the signal generators 490, 477, a respective PLL for each signal generator may be implemented. Similarly, while the RX PLL 482 is illustrated as being shared by the signal generators 480, 479, separate PLLs can be present in alternate implementations.

In some aspects, components in the phase shift circuitry 481 may comprise one or more adjustable or variable phased array elements, and may receive one or more control signals from the data processor 410 over a connection 494 and operate the adjustable or variable phased array elements based on the received control signals. In some aspects, the phase shift circuitry 481 comprises phase shifters 483 and phased array elements 487. Although three phase shifters 483 and three phased array elements 487 are shown for ease of illustration, the phase shift circuitry 481 may comprise more or fewer phase shifters 483 and phased array elements 487.

Each phase shifter 483 may be configured to receive the RF transmit signal from the upconverter 475, alter the phase by an amount, and provide the RF signal to a respective phased array element 487. Each phased array element 487 may comprise transmit and receive circuitry including one or more filters, amplifiers, driver amplifiers, and power amplifiers. In some embodiments, the phase shifters 483 may be incorporated within respective phased array elements 487. As described herein, mmW CA communications can be implemented with duplicated receive paths (e.g., in FIG. 5 with two paths with two paths for two channel CA, with line 515 in a first path and line 535 in a second path, with each path carrying a merged IF signal with data from the same two CA channels) for two CA channels which are out of phase, and used for beamforming.

The output of the phase shift circuitry 481 is provided to an antenna array 448. In some aspects, the antenna array 448 comprises a number of antennas that typically correspond to the number of phase shifters 483 and phased array elements 487, for example such that each antenna element is coupled to a respective phased array element 487. In some aspects, the phase shift circuitry 481 and the antenna array 448 may be referred to as a phased array.

In a receive direction, an output of the phase shift circuitry 481 is provided to a downconverter 485. In some aspects, the downconverter 485 may comprise an I/Q generation function 491 and a downconversion mixer 486. In some aspects, the mixer 486 downconverts the receive RF signal provided by the phase shift circuitry 481 to an IF signal according to RX RF LO signals provided by an RX RF LO signal generator 479. The I/Q generation function 491 receives the IF signal from the mixer 486 and generates I and Q signals for the downconverter 460, which downconverts the IF signals to baseband, as described above. While PLL 482 is illustrated in FIG. 4 as being shared by the signal generators 480, 479, a respective PLL for each signal generator may be implemented.

Figure 5:
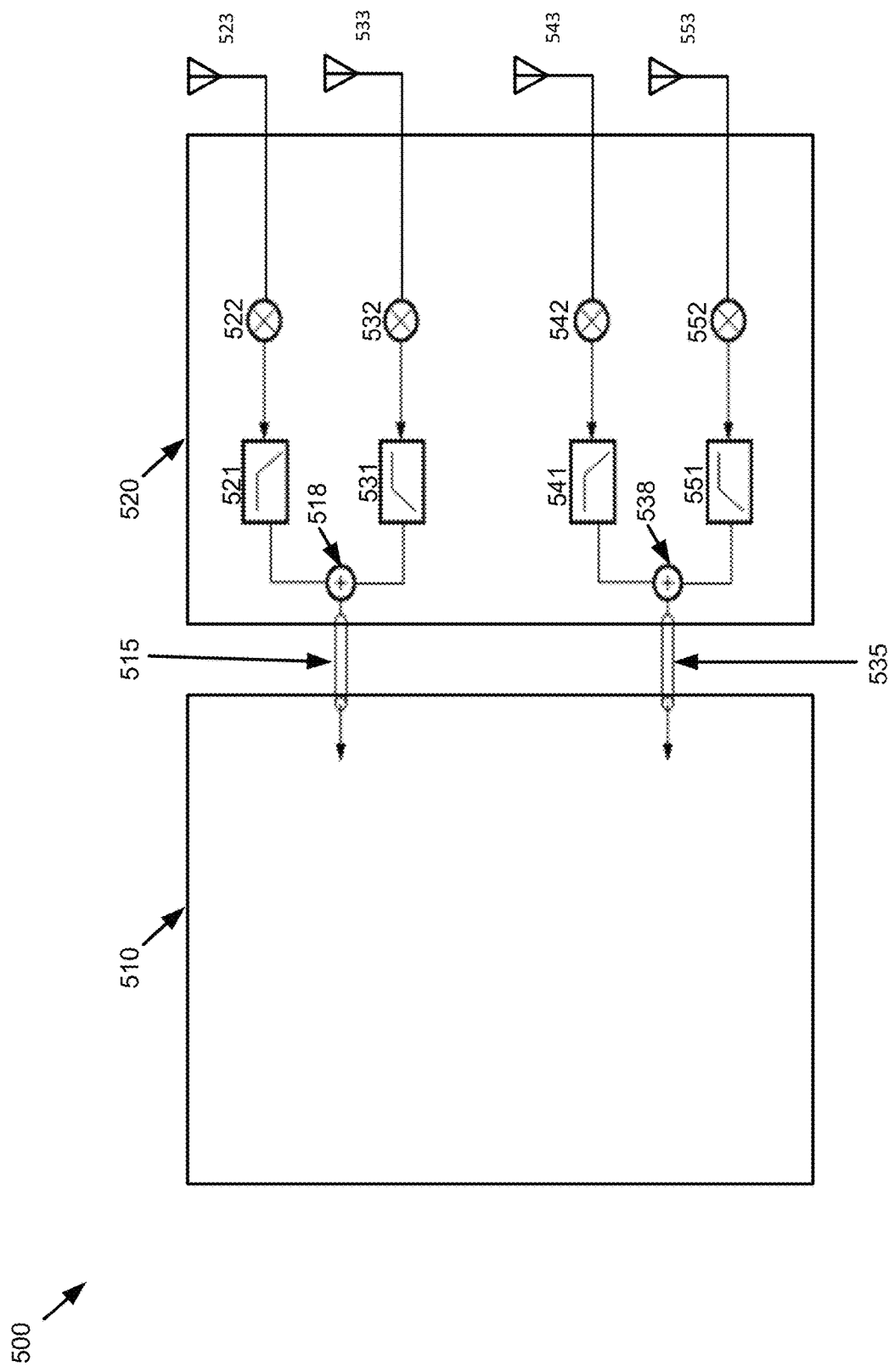
FIG. 5 illustrates aspects of mmW CA receiver that can be implemented with sliding (e.g., tunable) filters, according to aspects described herein.

FIG. 5 illustrates aspects of mmW CA receiver path 500 that can be implemented with sliding (e.g., tunable) filters, according to aspects described herein. As discussed above in FIG. 4, a transceiver can include a receive path, with mixing to downconvert a high frequency signal (e.g., RF or mmW signal) to an IF frequency signal, prior to downconversion to a baseband signal that can be converted to digital data for processing by a device. As discussed above, such a receive path can be implemented in multiple ICs. The mmW CA receiver path 500 includes an RFIC 520, and an IFIC 510. The RFIC 520 includes RF signal ports coupled to antennas 523, 533, 543, and 553. Antennas 523 and 543 are configured to receive the same data on the same CA channel, but out of phase for beamforming purposes (e.g., 90 degrees out of phase). Antennas 533 and 553 are similarly configured to receive the same data on the same CA channel, but out of phase for beamforming purposes. Antennas 523 and 543 are paired with low pass filters 521 and 541, and antennas 533 and 553 are paired with high pass antennas, so the antennas 523 and 543 receive signals on a CA channel that is lower in frequency than the signals received at the antennas 533 and 553.

The mixers 522, 532, 542, and 552 take the received signals and use an IF local oscillator (LO) (not shown) signal to downconvert the mmW signals received at the antennas 523, 533, 543, and 553 to IF signals. Filters 521, 531, 541, and 551 filter the IF signals to remove an additional information that may have been received on a corresponding antenna (e.g., from an interfering transmission on an adjacent channel made by a device not communicating with the device that includes the mmW CA receiver path 500). The lower frequency signals are filtered with low pass filters (e.g., the filters 521 and 541), and the higher frequency signals (e.g., from a higher frequency channel) are filtered with high pass filters (e.g., the filters 531 and 551). Additional details related to such filters are described below, particularly with respect to FIGS. 7-12. After the IF signals are filtered, the two separate CA signals from the antennas 523 and 533 are multiplexed by multiplexer 518, and the corresponding phase shifted signals from the antennas 543 and 553 are multiplexed at multiplexer 538. The multiplexer 518 uses a mmW transmission line 515 to transmit a merged IF CA signal to the IFIC 510, and the corresponding phase shifted signals from the multiplexer 538 are similarly transmitted to the IFIC as a merged IF CA signal via a mmW transmission line 535.

As mentioned above and described in more detail below, paths to communicate an IF data signal between an RFIC and an IFIC at such frequencies (e.g., the mmW transmission line 515 and the mmW transmission line 535) can be costly in terms of space, power usage, signal quality, and component cost. In some aspects, the transmission line 515 and the transmission line 535 can be many multiples of the wavelength of the signals transmitted on the lines (e.g., 10 centimeters (cm), 15 cm, 20 cm, etc.) Such costs are multiplied for CA communications with multiple IF data signals (e.g., one IF data signal for each carrier). By using two mmW transmission paths instead of four (e.g., one for each CA pair of antennas instead of one for each antenna), the number of transmission paths and associated costs (e.g., space, power, etc.) are halved.

Figure 6:
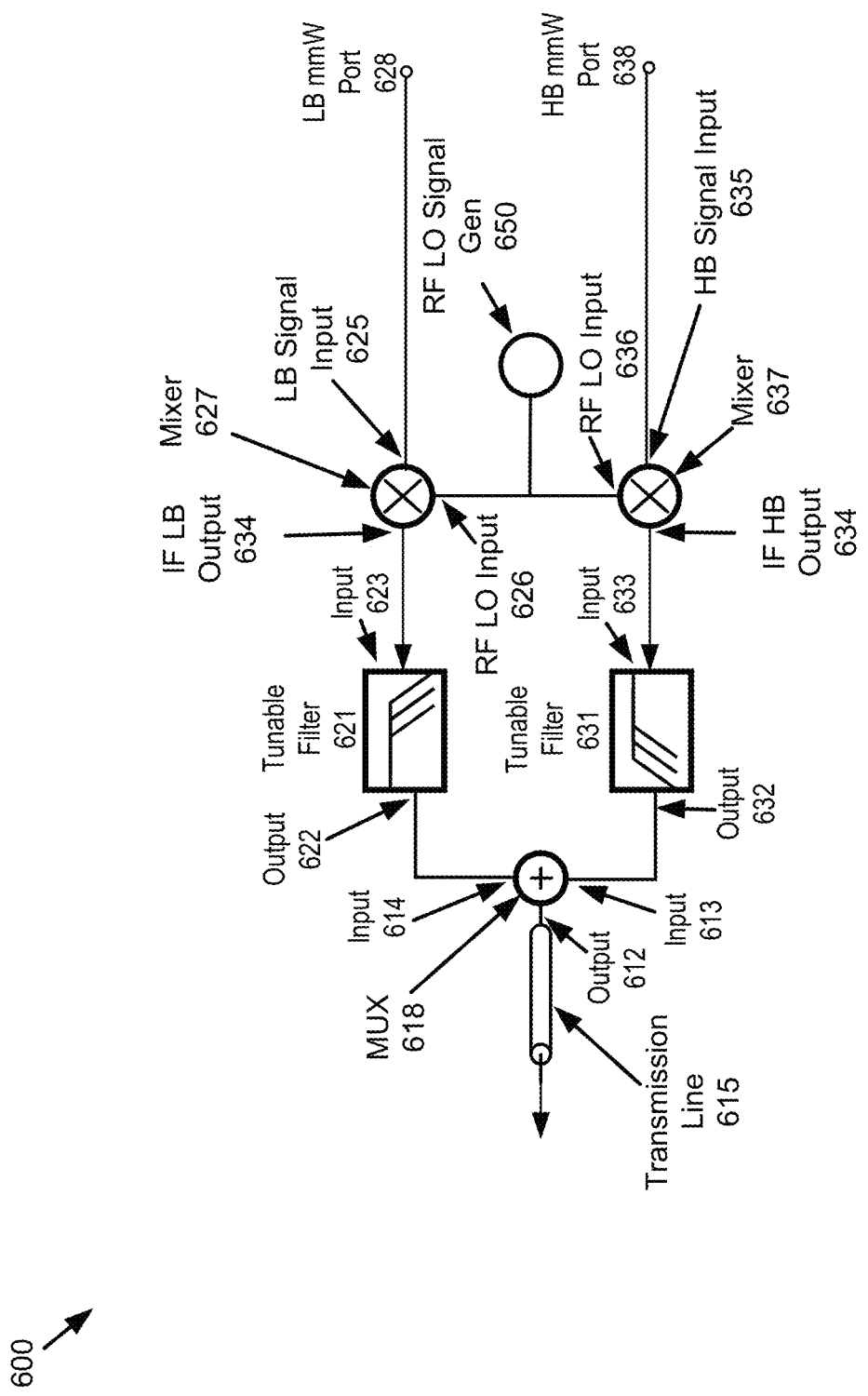
FIG. 6 illustrates aspects of mmW CA receiver that can be implemented with sliding (e.g., tunable) filters, according to aspects described herein.

FIG. 6 illustrates aspects of mmW CA receiver path 600 that can be implemented with sliding (e.g., tunable) filters, according to aspects described herein. The mmW CA receiver path 600 can be used to implement either of the paths illustrated in FIG. 5 (e.g., the path with the mmW transmission line 515 or the path with the mmW transmission line 535).

The mmW CA receiver path 600 includes a high band millimeter wave (mmW) carrier aggregation (CA) receive port 628, and a low band mmW CA receive port 638. Each of these ports can be coupled to a corresponding antenna, as illustrated in FIG. 5. The mmW CA receiver path 600 includes a high band mixer 637 including a radio frequency (RF) receive signal input 635, a radio frequency (RF) local oscillator (LO) input 636 (e.g., a LO input, which may accept any suitable frequency such as an RF frequency that can be used to downconvert a received wireless data signal to another frequency to assist in processing the wireless data signal), and an IF signal output 634. The RF receive signal input 635 is coupled to the high band mmW CA receive port 638. The RF local oscillator (LO) signal generator 650 generates an RF signal that is used by the mixer 627 to downconvert mmW frequency signals provided at input 625 to IF signals at output 634. In the illustrated mmW receiver path 600, the same RF LO signal generator 650 provides the same LO signal to both the mixer 627 and the mixer 637. In other implementations, separate RF LO signal generators can be used to provide different RF LO signals to the different mixers.

The mmW CA receiver path 600 includes a tunable high pass filter 631 including an input 633 and an output 632. The input 633 is coupled to the IF signal output 634 of the high band mixer 637. The mmW CA receiver path 600 includes an intermediate frequency (IF) received signal multiplexer 618 including a merged IF CA signal output 622, a first input 613, and a second input 614. The first input 613 is coupled to the output 632 of the tunable high pass filter 631. The mmW CA receiver path 600 includes a low band mixer 627 including an RF receive signal input 625, an intermediate frequency (IF) input 626, and an IF signal output 634. The RF receive signal input 625 is coupled to the low band mmW CA receive port 628.

The mmW CA receiver path 600 includes a tunable low pass filter 621 including an input 623 and an output 622. The input 623 is coupled to the IF signal output 634 of the low band mixer 627. The output 622 is coupled to the second input 614 of the IF received signal multiplexer 618. The mmW CA receiver path 600 includes a mmW transmission line 615 is coupled to the output 612 of the IF received signal multiplexer 618.

During operation, wireless communication signals are received at the low band mmW port 628 and the high band port 638. The communication signals can be in frequency bands defined by a communication standard, such as a 24 through 30 GHz band, a 37 through 43 GHz band, a 47-48 GHz band, or other such frequency spectrum ranges set aside for mmW wireless communications. Such bands can be divided into carrier bands which take up a subset of the full band, and the different carriers can be used in CA communications with a receiver including the mmW CA receiver path 600. The signal at the high band mmW port 638 is a higher frequency carrier than carrier received at the low band mmW port 628, to match the filtering in the associated signal path.

Systems with mmW communication functionality can, in addition to supporting the above mmW communication bands, support other communication technologies. One such technology is UWB communications, which use frequencies around or below 8.3 GHz, as well as other frequencies that use available frequency bands below such UWB frequencies. To prevent noise and to allow coexistance with UWB and other such communication band usage, IF frequencies used by mmW communication systems such as the architecture including the mmW CA receiver path 600 may be selected to be above 8.3 GHz. While use of IF such high frequencies for IF processing consumes more power, and caused phase shift issues, these issues can, in some implementations, cause fewer problems than overlapping IF frequencies with coexisting communication bands.

Figure 7:
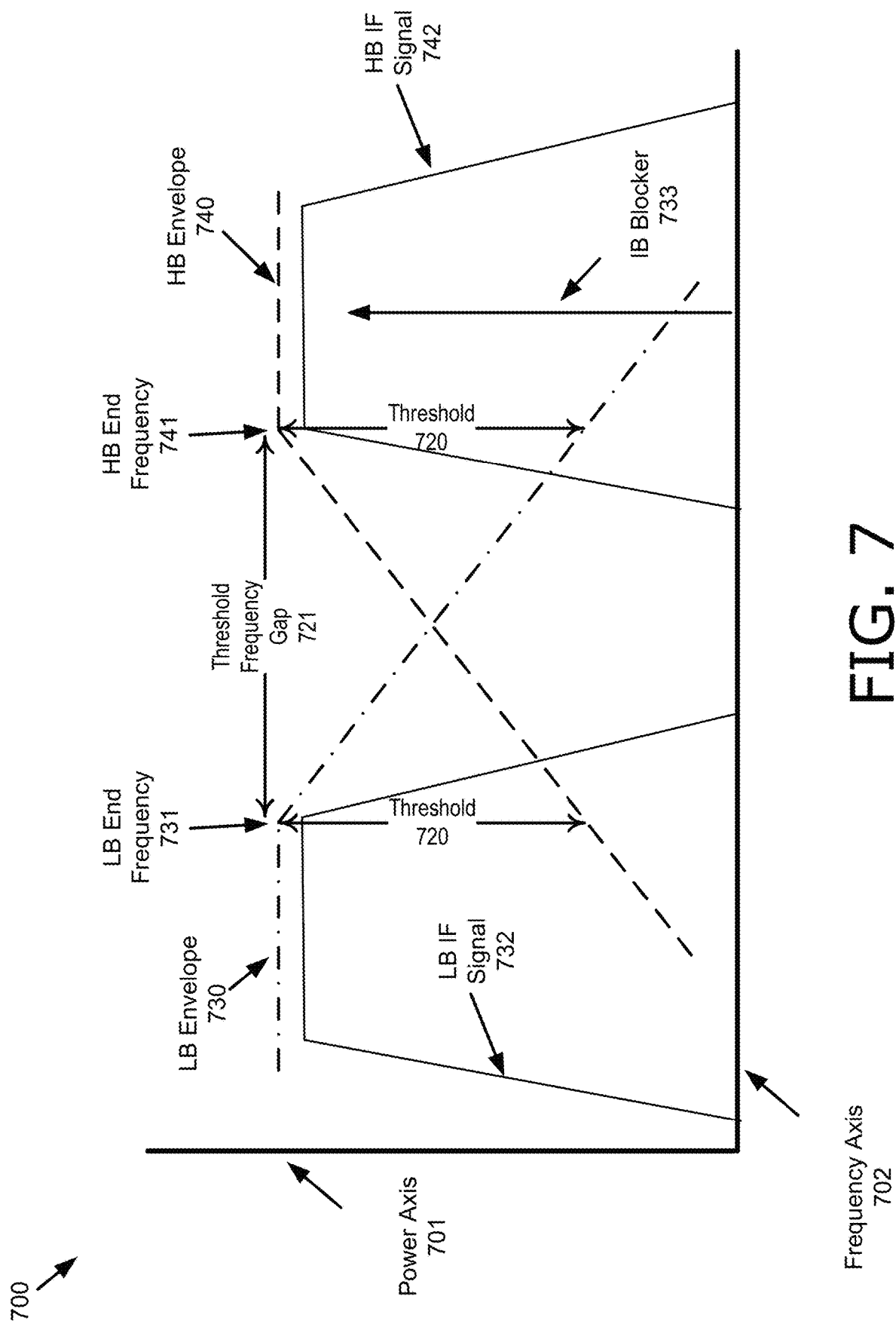
FIG. 7 illustrates aspects of mmW CA receiver operation with sliding (e.g., tunable) filters, according to aspects described herein.

FIG. 7 illustrates aspects of mmW CA receiver operation with sliding (e.g., tunable) filters, according to aspects described herein. FIG. 7 includes a chart 700 showing aspects of CA IF signals in accordance with aspects described herein. The chart 700 has a horizontal frequency axis 702 and a vertical power axis 701. The chart 700 shows a high band IF signal 742, which can be an IF signal output from a mixer such as the mixer 637 from a downconverted high band mmW signal. The chart shows a low band IF signal 732 and a low band blocker 733, which can be signals output from a mixer such as the mixer 627. The low band IF signal 732 and the low band blocker 733 are downconverted from a low band mmW signal and an adjacent channel (e.g., noise signal) received at a low band port such as the port 628. The chart 700 further shows a low band envelope 730 that describes a power envelope for a low band IF signal input to a multiplexer (e.g., the multiplexer 618, 518, or 538) and a high band envelope that describes a power for a high band IF signal input to a multiplexer (e.g., the multiplexer 618, 518, or 538). The low band end frequency 731 is a top corner frequency of a low band channel signal after downconversion to an IF (e.g., with power in the low band IF signal primarily lower than the low band end frequency 731), and the high band end frequency is a bottom corner frequency of a high band channel signal after downconversion to the IF (e.g., with power in the high band IF signal primarily higher than the high band end frequency 741).

A communication system with the mmW CA receiver path 600 will transmit a low band channel signal and a high band channel signal that, when downconverted to corresponding low band IF signal 732 and high band IF signal 742, will conform with the low band envelope 730 and the high band envelope 740, with the mixers (e.g., the mixer 627 and the mixer 637) generating IF signal 732 that will have a power below threshold 720 at a threshold frequency gap 721 from the corresponding end frequency 731 or 741. In the absence of other noise, a low band signal received at low band port 628, when downconverted by mixer 627, and output from mixer 627 as an IF signal, will have a signal power below threshold 720 at a frequency that is gap 721 distance from the low band end frequency 731.

Other devices near the device that transmit the low band mmW signal may transmit on an adjacent channel (e.g., with a similar but not exact frequency range). Such signals can be received at the low band port 628 with the expected data signal that the mmW CA receiver path 600 is expecting to process. Such an adjacent channel signal does not interfere with the adjacent channel signal that is expected (e.g., the low band RF data signal received at the low band port 628), as the adjacent frequencies are filtered out as part of the receive path for the signal. Such signals can, however, interfere with a merged CA IF signal (e.g., as IB blocker 733 interfering with the high band IF signal 742). The adjacent channel signal for the low band mmW CA signal, when a higher frequency, can be downconverted with the low band mmW CA signal, resulting in the in band blocker 733 in the IF frequency range that is in the IF spectrum for the high frequency IF signal 742 (e.g., downconverted from the high band mmW CA signal). When such an in band blocker 733 signal has a power above the LB envelope 730 established for the signals received at the low band port 628, and in the signal frequency of the HB envelope 740 (e.g., above the high band end frequency 741 and below an opposite end frequency for the high band IF signal), such a signal can result in errors, or can make the high band channel unusable. Tunable filters such as the tunable filter 621 can filter out such in band blocking signals (e.g., IB blocker 733), to keep the low band IF signal input to a multiplexer (e.g., the multiplexer 618 at the second input 614) below the threshold 720 at a frequency gap 721 distance. Similarly, the tunable filter 631 can keep similar in band blocking signals (e.g., originating in a channel just below the high band mmW signal received at the high band port 638 from a nearby device) below the threshold 720 at the gap 721 distance (e.g., a frequency difference between the end frequencies of the gap 721).

Describing the operation of the mmW CA receiver path 600 in the context of the chart 700, a pair of CA mmW frequency signals are received at the port 628 (e.g., the lower frequency mmW carrier signal) and the port 638 (e.g., the high frequency mmW carrier signal). The signals are down converted at corresponding mixers 627 and 637. Each of these signals may have adjacent signals that are received with the targeted received signal intended for the device implementing the mmW CA receiver path 600. Such adjacent signals are downconverted as part of the output IF signal at the IF low band output 634. The tunable filter 621 suppresses such adjacent signals at the output 622, such that a merged CA IF signal at the output 622 and the transmission line 615 has suppressed the adjacent signals to below the threshold 720 at the frequency gap 721 from each of the end frequencies 731 and 741 of the corresponding high and low IF ranges. The signal communicated on the transmission line 615 (e.g., from an RFIC such as the RFIC 520 to an IFIC such as the IFIC 510), can include the CA signals (e.g., the low band IF signal 732 and the high band IF signal 742) with an adjacent in band blocking signals (e.g., the in band blocker 733) suppressed below a threshold 720 that will limit decoding errors in the data from the high band IF signal 742 (e.g., and the corresponding high band mmW signal).

In some aspects, the merged IF CA signal output from the output 622 of the multiplexer 618 is communicated via the transmission line 615 to an IF integrated circuit (e.g., the IFIC 510 of FIG. 5). In some such implementations, the high band mixer 637, the tunable high pass filter 631, the IF received signal multiplexer 618, the low band mixer 627, and the tunable low pass filter 621 are structured as part of an RF integrated circuit with a duplicate circuit used for beamforming of the mmW CA signals received at the low band port 628 and the high band port 638.

Processing of the merged mmW IF CA signal from the multiplexer 618 can be performed at the IFIC, with the IFIC configured to downconvert is configured to separate the low band IF signal and the high band IF signal from the merged IF CA signal and downconvert separated IF signals to corresponding baseband frequencies for communication to modem circuitry or other processing circuitry.

Figure 8:
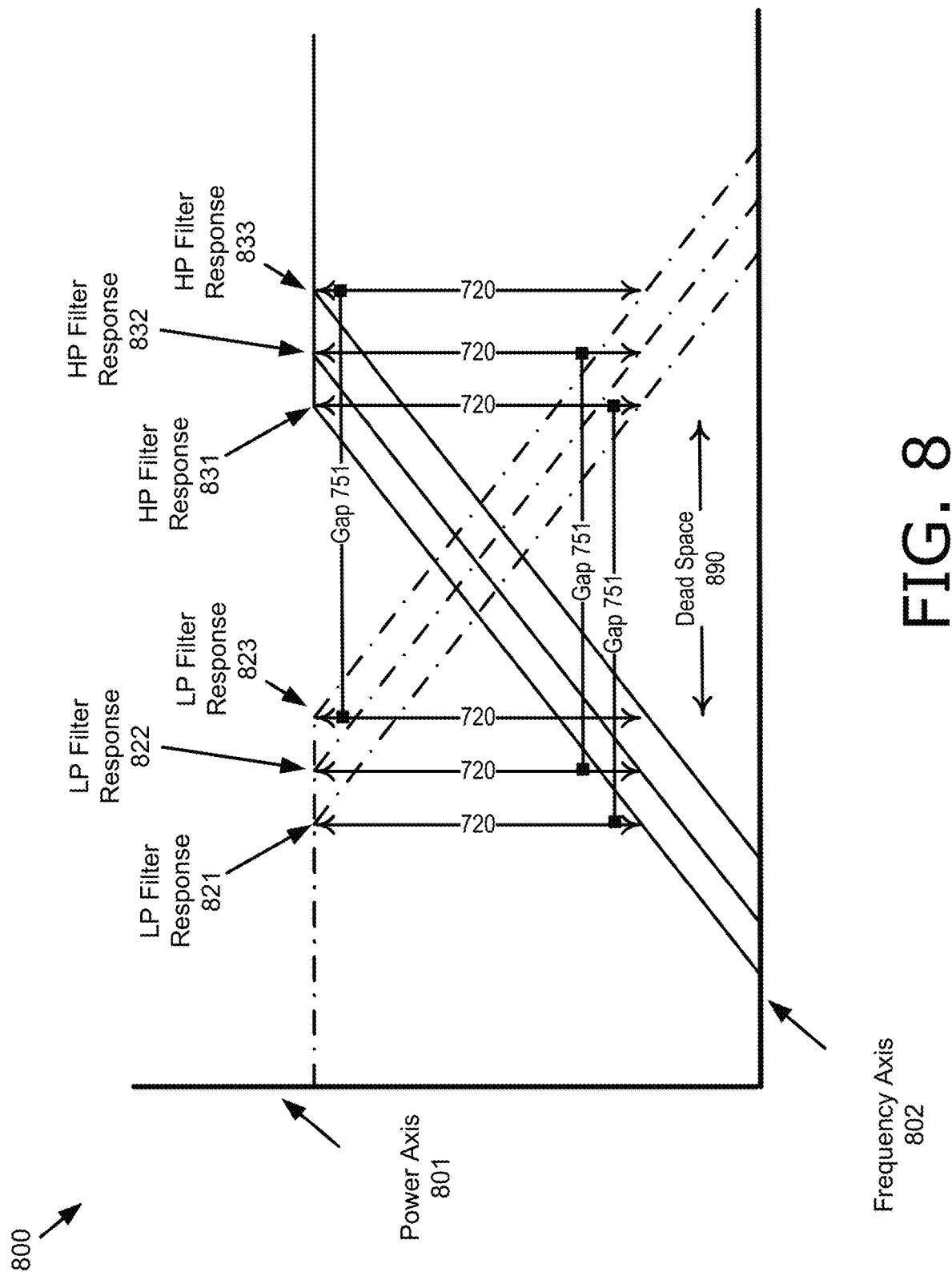
FIG. 8 illustrates aspects of mmW CA receiver operation with sliding (e.g., tunable) filters, according to aspects described herein.

FIG. 8 illustrates aspects of mmW CA receiver operation with sliding (e.g., tunable) filters, according to aspects described herein. For fixed filters in a mmW CA receiver path, the threshold frequency gap 721 creates a dead frequency gap that may not be used for communications. In some implementations, with the IF low band end frequency around 8.8 GHz and the high band end frequency 741 around 10.8 GHz, a threshold frequency gap 721 may be used to prevent the low band IF signal 732 and the high band IF signal 742 from interfering with each other. Such a fixed gap 721 is not needed in all situations, but may be needed in some environments, and so without tunability, a significant amount of frequency space is unused to allow CA operations as described above.

FIG. 8 illustrates the use of tuning settings in tunable filters such as filters 621 and 631 to reduce or eliminate the dead space 890. FIG. 8 includes a chart 800 having the same frequency axis 802 and power axis 801 as FIG. 7. FIG. 8 illustrates tunable filter responses for both a high pass filter such as the tunable high pass filter 631 and a low pass filter such as the tunable low pass filter 621. The low pass filter has multiple low pass filter response curves 821, 822, and 823 which are selectable tunable by control circuitry. Similarly, the high pass filter has selectable filter response curves 831, 832, and 833 also selectable by control circuitry. The high pass and low pass filters can be tuned together to maintain the gap 751 for each controllable setting, but the frequency dead space 890 in such a device shrinks to less than the gap 751. In some implementations, the tunability of the filters can generate filter response curves such that the dead space 890 is completely eliminated.

By allowing tunable filters and reducing the dead space 890, the IF frequency space can flexibly be used for frequency plans (e.g., controlled by the blocks 350 and 340 described above) to allow flexible use of the IF frequency space. Such IF channel usage can, for example, be used to allow frequency planning to adjust IF frequencies for spur avoidance (e.g., from noise sources such as LO harmonics, channel leakage, etc.), or coexistence with other communication standards such as UWB, WiFi, new radio, etc.

In some aspects, a mmW receiver path can implement IF multiplexing for CA as described above with a low band IF occupying a frequency range starting at approximately 8 GHz, and the high band IF frequency ending at about 12 GHz. With a fixed filter structure, 2 GHz out of 6 GHz of such an IF band can be devoted to a dead gap space to prevent carrier conflicts between the high and low band carriers. By using tunable filters as described above, a 2 GHz gap can be maintained, but adjusted within the IF band to allow different combinations of high and low carriers to shift within the IF band based on various criteria (e.g., spurs or other noise sources that occur within the IF band for a particular combination of carriers). Control circuitry can dynamically shift the frequencies used within the IF band for a given pair of high and low carriers of a mmW CA system. When compared with a system using fixed IF frequencies for high and low CA IF signals, the dynamic flexibility of the receiver paths described above can provide significant improvements to signal performance (e.g., reduced noise), design flexibility, and coexistence with other communications systems operating around or near the IF frequency band. Such a system additional supports the merged IF CA signals described above which improve device performance by reducing the number of chip-to-chip communication paths in some implementations (e.g., the transmission lines 515, 535).

Figure 9:
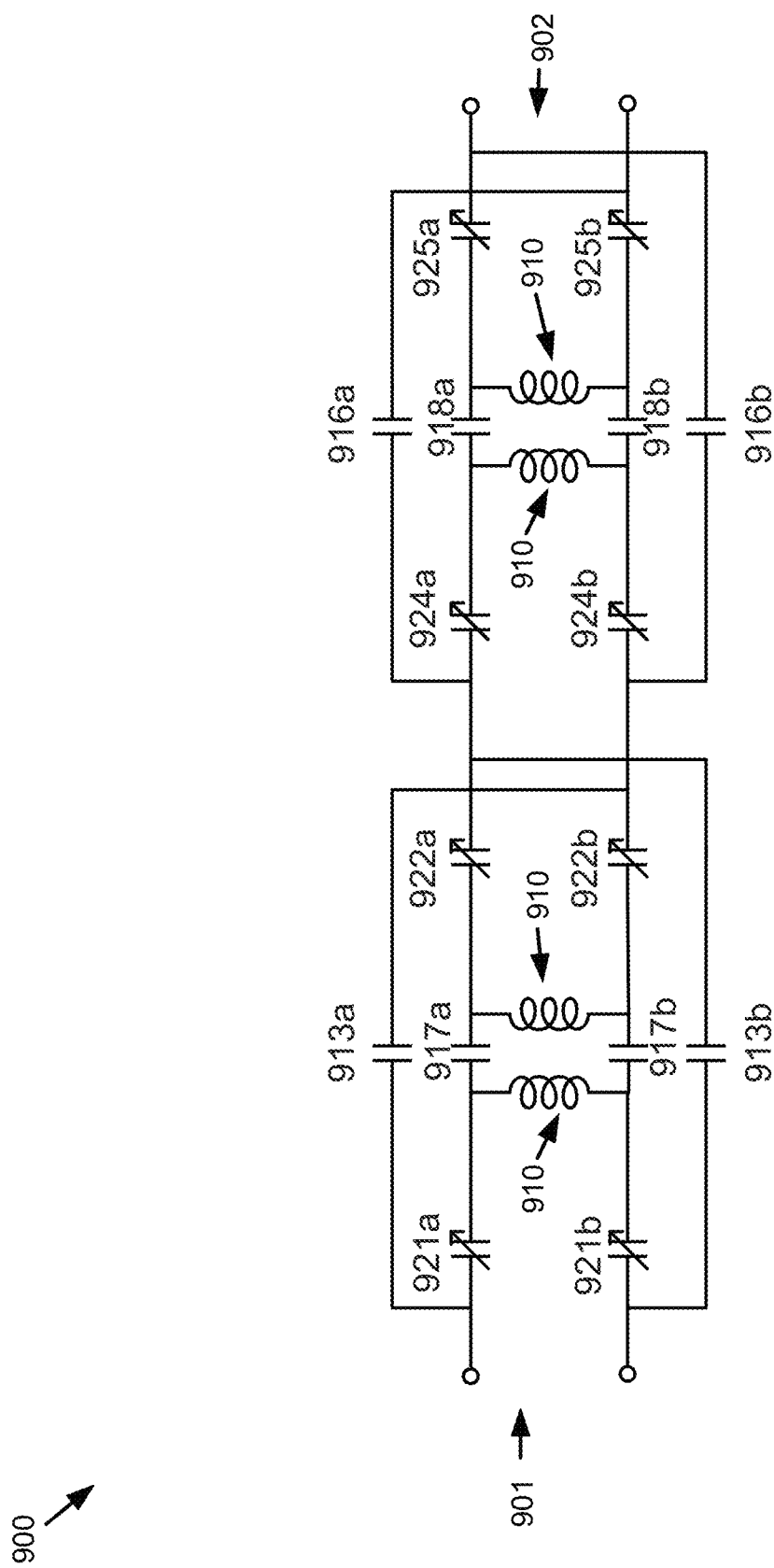
FIG. 9 illustrates an example tunable (e.g., sliding) filter, according to aspects described herein.

FIG. 9 illustrates an example tunable (e.g., sliding) high pass filter 900, according to aspects described herein. The high pass filter 900 has an input 901 (e.g., corresponding to the input 633 of the tunable filter 631) and an output 902 (e.g., corresponding to the output 632 of the tunable filter 631). The tunable high pass filter 900 includes fixed inductors 910 in addition to tunable and fixed capacitors in capacitor banks. The capacitor banks consists of tunable capacitors 921a, 921b, 922a, 922b, 924a, 924b, 925a and 925b to program the corner frequency (e.g., the high band end frequency 741). The capacitors can be controlled to step the corner frequency of the tunable high pass filter 900 in accordance with channel stepping, and can be controlled by control circuitry that dynamically adapts to a given CA operating mode. The tunable capacitors can have values set by the control circuitry 320 based on CA operating modes and other operating conditions determined by the codebook and AGC management block 350, the CA block 340, and the filter management block 330. In other implementations, other such control circuitry and filter programming structures can be used. The fixed capacitors 913a, 913b, 916a, 916b, 917a, 917b, and the inductors 910 maintained the same values determined by the initial system design. High pass filter 900 illustrates one example of a tunable filter with an adjustable corner frequency (e.g., envelope end frequency). In various examples, any number of corners can be programmable by different filter designs to create the given performance for merged IF CA signals and to reduce or eliminate a dead space 890 in an IF frequency range.

Figure 10:
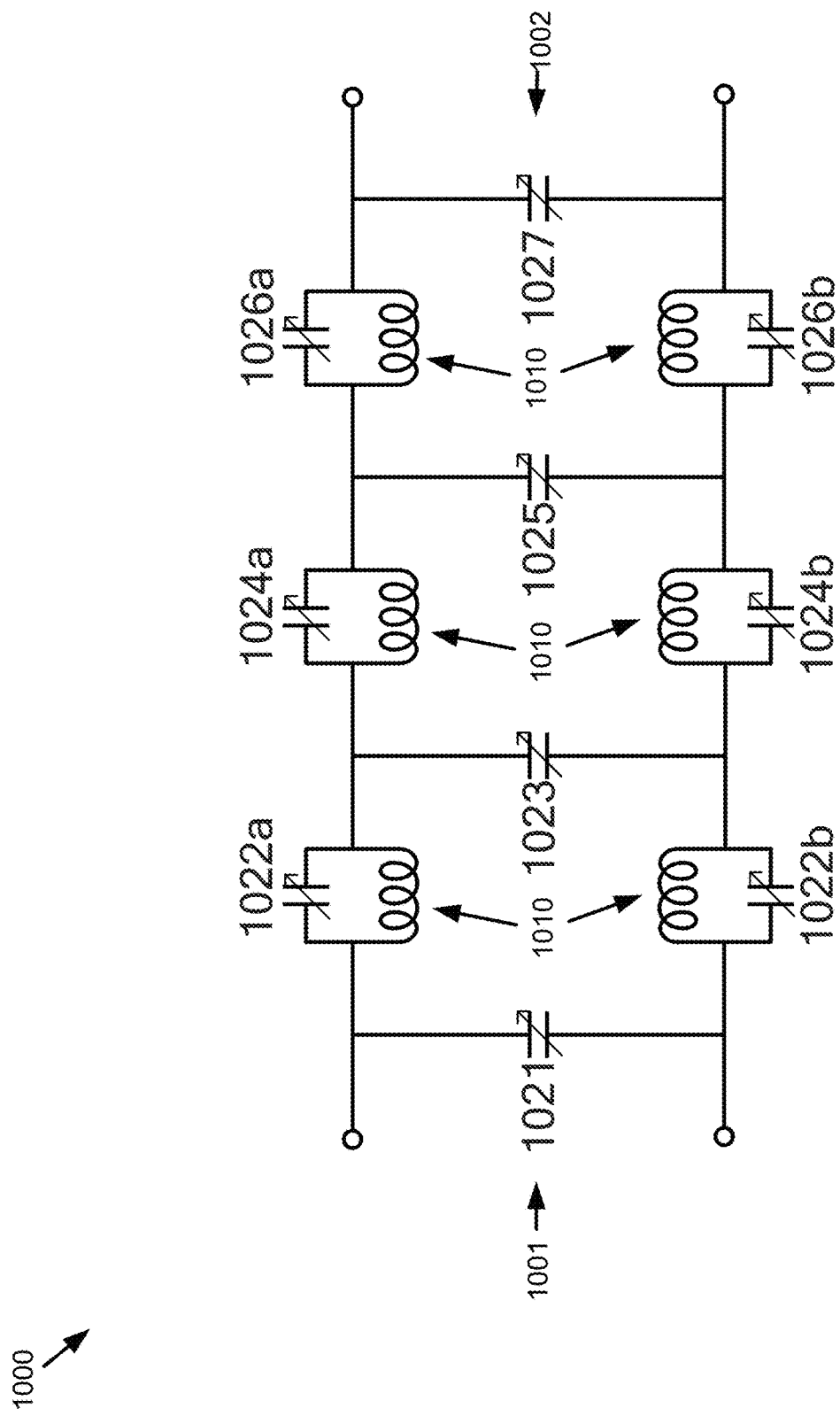
FIG. 10 illustrates an example tunable (e.g., sliding) filter, according to aspects described herein.

FIG. 10 illustrates an example tunable (e.g., sliding) low pass filter 1000, according to aspects described herein. Similar to the filter 900 of FIG. 9, the low pass filter 1000 has an input 1001 (e.g., similar to the input 623 of the tunable filter 621) and an output 1002 (e.g., similar to the output 622 of the tunable filter 621). Also similar to the filter 900, the filter 1000 includes tunable capacitors 1021a, 1021b, 1022a, 1022b, 1024a, 1024b, 1025a and 1025b to program the corner frequency of a filter response (e.g., associated with the low band end frequency 731). The fixed capacitors 1013a, 1013b, 1016a, 1016b, 1017a, 1017b, and the inductors 1010 maintained the same values determined by the initial system design. Just as with the high pass filter 900, the low pass filter 1000 illustrates one example of a tunable filter with an adjustable corner frequency (e.g., envelope end frequency). In various examples, any number of selectable corners can be programmable by different filter designs to create the given performance for merged IF CA signals and to reduce or eliminate a dead space 890 in an IF frequency range.

Figure 11:
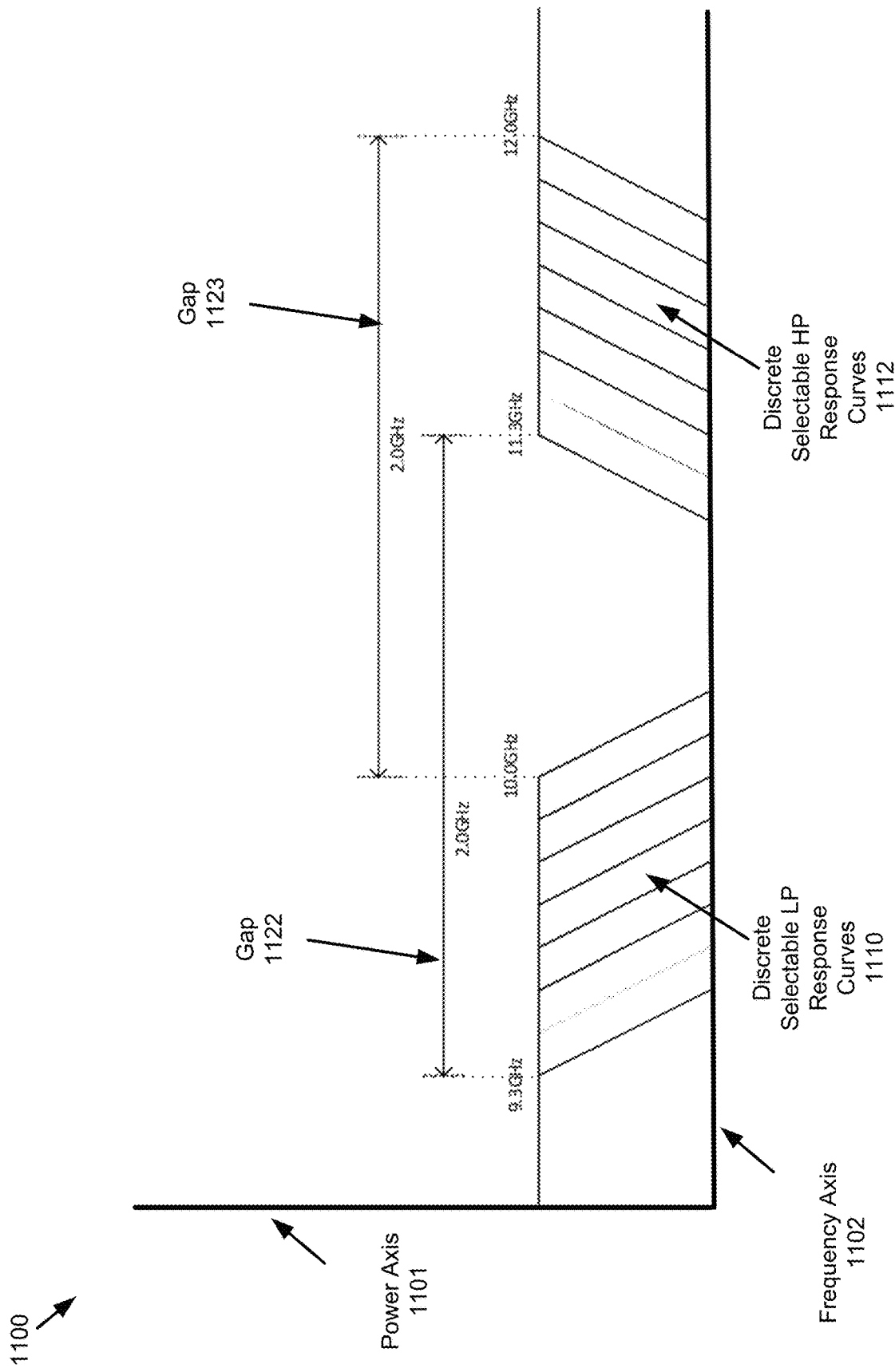
FIG. 11 illustrates aspects of mmW CA receiver operation with sliding (e.g., tunable) filters, according to aspects described herein.

FIG. 11 illustrates aspects of mmW CA receiver operation with sliding (e.g., tunable) filters, according to aspects described herein. FIG. 11 shows a chart 1100 with a frequency axis 1102 and a power axis 1101 similar to FIGS. 7 and 8 above. The chart 1100 illustrates discrete selectable low pass response curves 1110 selectable by control of a low pass filter (e.g., by controlling tunable capacitors 1021a, 1021b, 1022a, 1022b, 1024a, 1024b, 1025a and 1025b to program the corner frequency and the corresponding curve of the discrete selectable low pass response curves 1110). The chart 1100 also includes discrete selectable high pass response curves 1112 (e.g., selectable by controlling tunable capacitors 921a, 921b, 922a, 922b, 924a, 924b, 925a and 925b to program the corner frequency and associated response curve of the discrete selectable high pass response curves 1112). The corner frequencies can be matched to carrier end frequencies can be controlled by the capacitors to step in accordance with channel stepping associated with CA communications. Such channel stepping and can be controlled by control circuitry that dynamically adapts to a given CA operating mode and the frequencies used during a given operational state. Additionally, in some aspects, the tunable low pass filter 1000 can be tuned in conjunction with a high pass filter such as the tunable high pass filter 900 to maintain a gap (e.g., the gap 721) between the corner frequencies programmed by control of the capacitors for the filters. The chart illustrates a gap 1122 for a lowest frequency curve of each of the response curves 1110 and 1112, and a gap 1123 for the highest frequency curve of each of the response curves 1110 and 1112. Such a matched tuning can be implemented with the control circuitry 320 based on CA operating modes and other operating conditions determined by the codebook and AGC management block 350, the CA block 340, and the filter management block 330. In other implementations, other such control circuitry and filter programming structures can be used.

Figure 12:
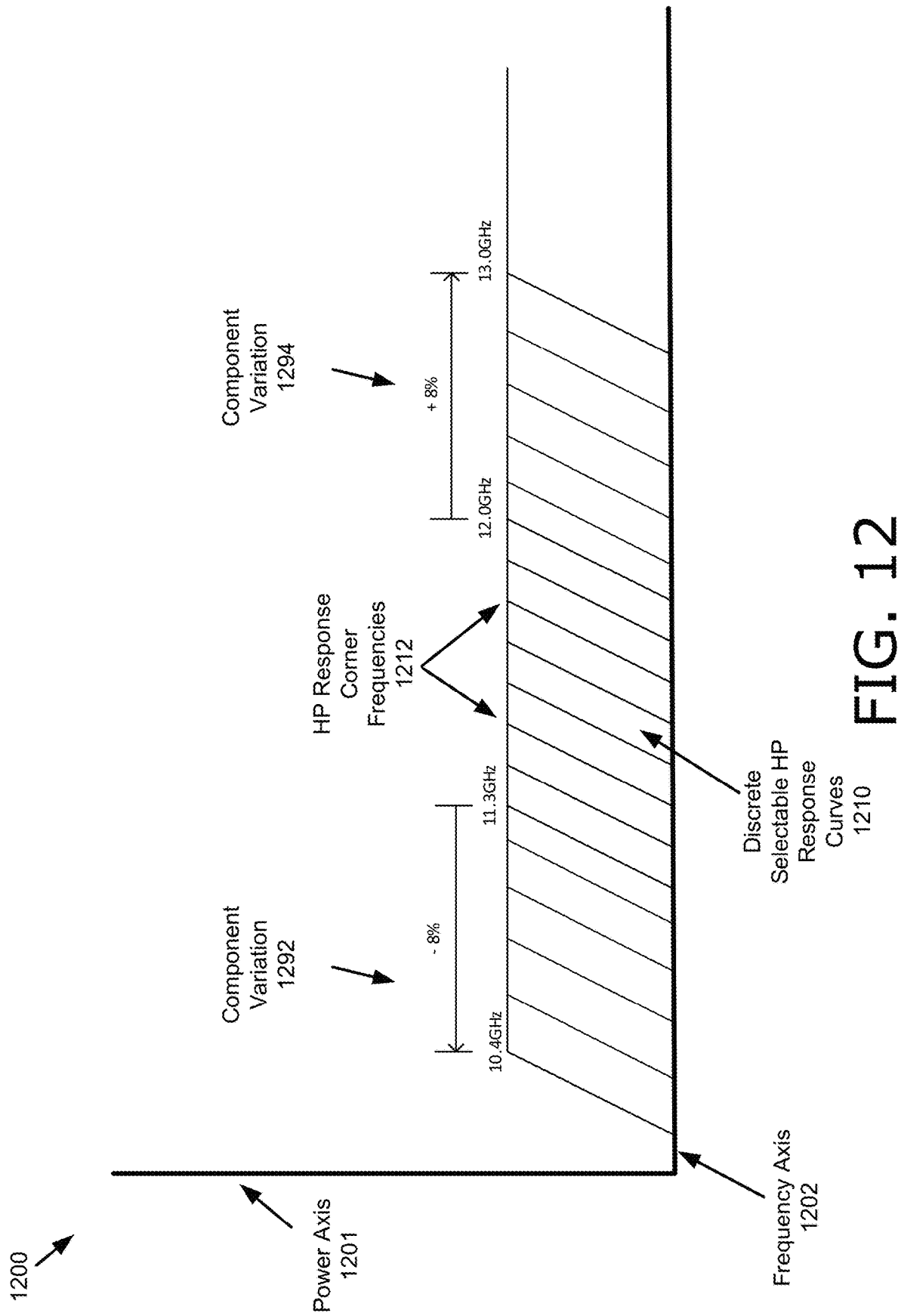
FIG. 12 illustrates aspects of mmW CA receiver operation with sliding (e.g., tunable) filters with filter components including values within a predefined tolerance that can impact tuning operations, according to aspects described herein.

FIG. 12 illustrates aspects of mmW CA receiver operation with sliding (e.g., tunable) filters with filter components including values within a predefined tolerance that can impact tuning operations, according to aspects described herein. In addition to tuning values for the CA channel stepping based on CA channels in use, fabrication on an IC of tunable filters such as the tunable filters 900 and 1000 can involve components that are not exact.

FIG. 12 includes chart 1200 that includes frequency axis 1202 and power axis 1201 similar to the charts 1200, 700, and 800 above. The chart 1200 illustrates discrete selectable high pass response curves 1210 generated by a tunable high pass filter (e.g., the filter 900 or the tunable filter 621) fabricated with components where device tolerances (e.g., variation between a planned capacitor or inductor value and an actual value varies by a tolerance amount), can result in actual filter performance shifting from expected filter performance. Fabrication of a device can result in expected programming values for tunable capacitors in a tunable filter resulting in corner frequencies 1212 and response curves 1210 that vary significantly from the expected results. A tunable filter as described herein can thus be associated with a calibration process where the control circuitry inputs used to set a given response curve (e.g., the high pass response corner frequencies 1212 and the associated discrete selectable response curves 1210) are adjusted based on an unknown actual filter values due to the component variations 1292 and 1294 impacting the filter performance. In some implementations, control circuitry can be programmed by selecting the control values to select one or more of the discrete selectable high pass response curves 1210 based on the capacitor values matching the design values, observing the actual response curve that results (e.g., due to the difference between the actual values and the design values resulting from manufacturing variations), and calibrating the control circuitry control values to match control values to actual response curves. Such a calibration process can be used to confirm that threshold suppression (e.g., associated with the threshold 720) and threshold frequency gaps (e.g., the threshold frequency gap 721) are implemented property to prevent degraded communication performance in devices due to component variation in filters. The use of tunable filters further improves on non-tunable filters due to the ability of devices with tunable filters to calibrate away variations in IF filters due to component variation.

In some aspects, the mmW CA receiver path 600 can further include control circuitry (not shown) coupled to the tunable high pass filter 631 and the tunable low pass filter 621. The control circuitry can be configured to dynamically determine a low band frequency range (e.g., a corner or end frequency) associated with the low band channel and a high band frequency range associated with the high band channel, and dynamically adjust the tunable low pass filter 631 and the tunable high pass filter 631 based on the low band frequency range and the high band frequency range.

In some aspects, such control circuitry can be configured to dynamically adjust the tunable low pass filter and the tunable high pass filter to suppress in-band blocking signals of the second wireless data signal that would interfere with the high band IF signal. Such tuning can be based on the actual frequencies of the CA signals as well as settings to maintain a gap between the IF signals that are merged for communication between an RFIC and an IFIC.

In some aspects, such control circuitry is dynamically configured to adjust the tunable low pass filter to generate a threshold signal suppression amount at a threshold frequency gap from an end frequency of the low band channel and to generate the threshold signal suppression amount at a threshold frequency distance from an end frequency of the high band channel. In some implementations, the control circuitry can dynamically identify noise and errors resulting from excessive in band blocking signals, noise spikes, or various noise sources within an IF band, and adjust tunable filter settings based on such noise identification. In other implementations, a CA channel may be turned off if filter tuning is not able to reduce noise and error performance below a threshold level. In some such implementations, a threshold signal suppression amount (e.g., the threshold 720) is 30 decibels (dB), and the threshold frequency distance (e.g., the gap 721) is 2 gigahertz (GHz).

In one implementation, the end frequency (e.g., the corner frequency of the low pass filter response) of the low band channel is configurable from a frequency of 8.8 GHz to a frequency of 10 GHz. In such an implementation, the end frequency of the high band channel (e.g., the corner frequency of the high pass filter response) is configurable from a frequency of 10.8 GHz to a frequency of 12 GHz. In some implementations, the filters can be designed such that the highest corner frequency of the low pass filter is higher than the lowest corner frequency of the high pass filter. Such an implementation can add filter complexity in exchange for additional flexibility in implementing noise suppression for spurs, coexistence with other communication technologies, or other such improvements.

Figure 13:
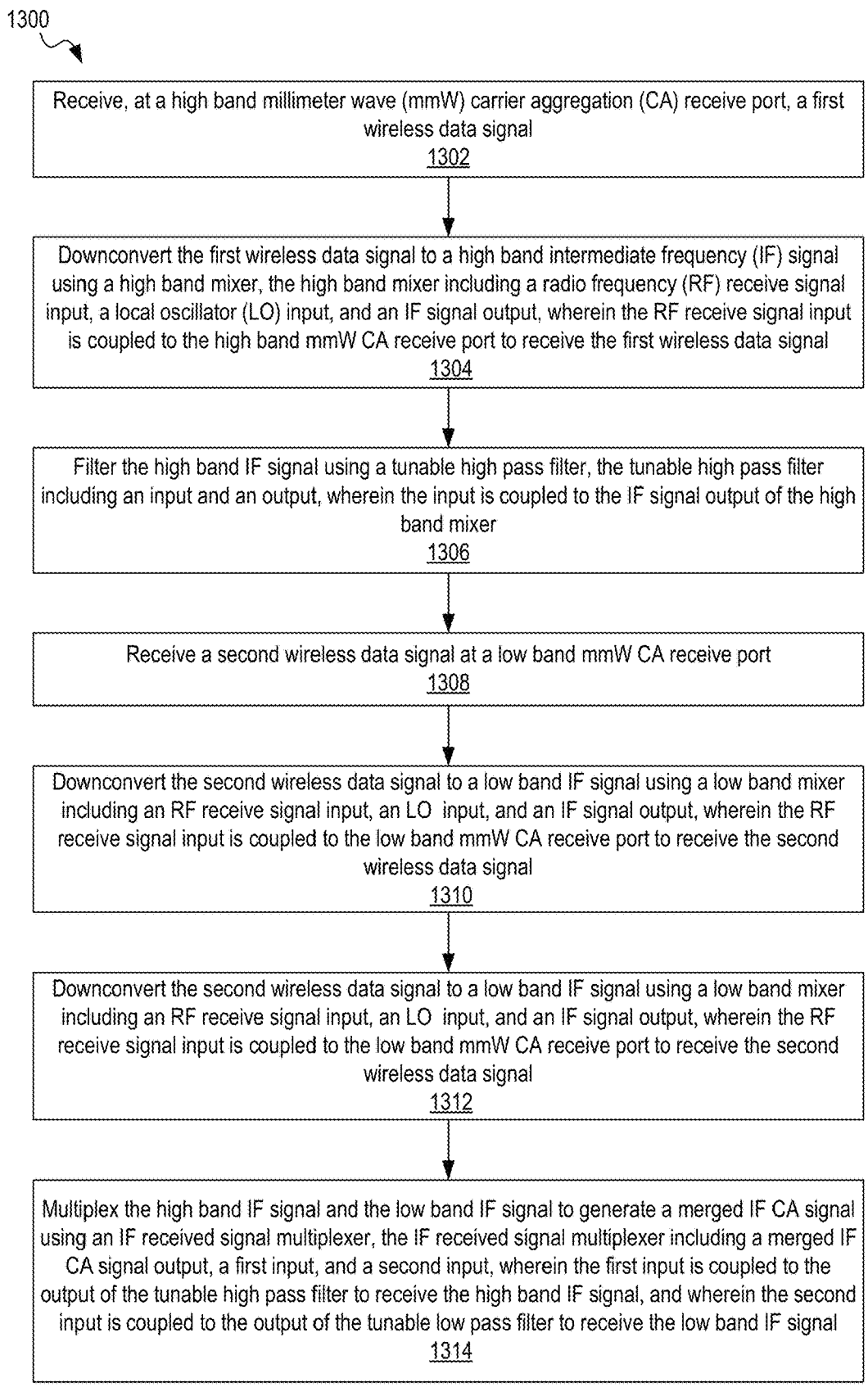
FIG. 13 illustrates aspects of a method for correcting OAM beam misalignment, according to aspects described herein.

FIG. 13 is a flow diagram describing an example of the operation of a method 1300 for operation of a wireless communication apparatus with a receiver including spur suppression for mmW CA functionality in accordance with aspects described herein. In some aspects, the described operations can be performed by a device including a memory and processing circuitry coupled to the memory and configured to perform the operations of the method 1300. In some aspects, the method 1300 can be embodied as instructions stored in a non-transitory computer readable storage medium that, when executed by processing circuitry (e.g., control circuitry) of a device, cause the device to perform the operations of method 1300 described below. The blocks in the method 1300 can be performed in or out of the order shown, and in some embodiments, can be performed at least in part in parallel.

Method 1300 includes block 1302, which involves receiving, at a high band millimeter wave (mmW) carrier aggregation (CA) receive port, a first wireless data signal. As described herein, any signal propagated through a device that is initially received at an antenna via a wireless signal path (e.g., a data signal received by an antenna of the device 110 or the base station 132) is a wireless data signal. Similarly, a data signal generated in a TX path which is configured to radiate the signal using an antenna can be referred to as a wireless data signal, even when the signal has not yet been transmitted via a wireless path between antennas.

Method 1300 also includes block 1304, which involves downconverting the first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal.

Method 1300 also includes block 1306, which involves filtering the high band IF signal using a tunable high pass filter, the tunable high pass filter including an input and an output, wherein the input is coupled to the IF signal output of the high band mixer.

Method 1300 also includes block 1308, which involves receiving a second wireless data signal at a low band mmW CA receive port.

Method 1300 also includes block 1310, which involves downconverting the second wireless data signal to a low band IF signal using a low band mixer including an RF receive signal input, an LO input, and an IF signal output, wherein the RF receive signal input is coupled to the low band mmW CA receive port to receive the second wireless data signal.

Method 1300 also includes block 1312, which involves filtering the low band IF signal using a tunable low pass filter, the tunable low pass filter including an input and an output, wherein the input is coupled to the IF signal output of the low band mixer, and wherein the output is coupled to the second input of the IF received signal multiplexer; and Method 1300 also includes block 1314, which involves multiplexing the high band IF signal and the low band IF signal to generate a merged IF CA signal using an IF received signal multiplexer, the IF received signal multiplexer including a merged IF CA signal output, a first input, and a second input, wherein the first input is coupled to the output of the tunable high pass filter to receive the high band IF signal, and wherein the second input is coupled to the output of the tunable low pass filter to receive the low band IF signal.

FIG. 14 is a functional block diagram of a wireless communication apparatus configured for OAM multiplexing in accordance with aspects described herein. The apparatus 1400 comprises means 1402 downconverting the first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal, means 1404 filtering the high band IF signal using a tunable high pass filter, the tunable high pass filter including an input and an output, wherein the input is coupled to the IF signal output of the high band mixer, means 1406 for downconverting the second wireless data signal to a low band IF signal using a low band mixer including an RF receive signal input, an LO input, and an IF signal output, wherein the RF receive signal input is coupled to the low band mmW CA receive port to receive the second wireless data signal, means 1408 for filtering the low band IF signal using a tunable low pass filter, the tunable low pass filter including an input and an output, wherein the input is coupled to the IF signal output of the low band mixer, and wherein the output is coupled to the second input of the IF received signal multiplexer, and means 1410 for multiplexing the high band IF signal and the low band IF signal to generate a merged IF CA signal using an IF received signal multiplexer, the IF received signal multiplexer including a merged IF CA signal output, a first input, and a second input, wherein the first input is coupled to the output of the tunable high pass filter to receive the high band IF signal, and wherein the second input is coupled to the output of the tunable low pass filter to receive the low band IF signal.

The circuit architecture described herein described herein may be implemented on one or more ICs, analog ICs, mmWICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR) or corresponding mmW elements, (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

Illustrative aspects of the present disclosure include, but are not limited to:

Aspect 1. A wireless communication apparatus, comprising: a high band millimeter wave (mmW) carrier aggregation (CA) receive port; a high band mixer including a radio frequency (RF) receive signal input, a local oscillator (LO) input, and an IF signal output, wherein the RF receive signal input is coupled to the high band mmW CA receive port; a tunable high pass filter including an input and an output, wherein the input is coupled to the IF signal output of the high band mixer; an intermediate frequency (IF) received signal multiplexer including a merged IF CA signal output, a first input, and a second input, wherein the first input is coupled to the output of the tunable high pass filter; a low band mmW CA receive port; a low band mixer including an RF receive signal input, an LO input, and an IF signal output, wherein the RF receive signal input is coupled to the low band mmW CA receive port; a tunable low pass filter including an input and an output, wherein the input is coupled to the IF signal output of the low band mixer, and wherein the output is coupled to the second input of the IF received signal multiplexer.

Aspect 2. The wireless communication apparatus of Aspect 1, further comprising: a mmW transmission path coupled to the output of the IF received signal multiplexer.

Aspect 3. The wireless communication apparatus of any of Aspects 1 to 2, further comprising: an IF integrated circuit; wherein the high band mixer, the tunable high pass filter, the IF received signal multiplexer, the low band mixer, and the tunable low pass filter are structured as part of an RF integrated circuit; and wherein the mmW transmission path couples the merged IF CA signal output of the IF received signal multiplexer to the IF integrated circuit.

Aspect 4. The wireless communication apparatus of any of Aspects 1 to 3, wherein the high band mmW CA receive port is configured to receive a first wireless data signal in a high band channel of a CA system; and wherein the low band mmW CA receive port is configured to receive a second wireless data signal in a low band channel of the CA system.

Aspect 5. The wireless communication apparatus of any of Aspects 1 to 4, wherein the high band mixer is configured to downconvert the first wireless data signal to a high band IF signal using an LO signal; wherein the low band mixer is configured to downconvert the second wireless data signal to a low band IF signal using the LO signal; and wherein the IF received signal multiplexer is configured to merge the low band IF signal and the high band IF signal into a merged IF CA signal for transmission to the IF integrated circuit via the mmW transmission path.

Aspect 6. The wireless communication apparatus of any of Aspects 1 to 5, further comprising control circuitry coupled to the tunable high pass filter and the tunable low pass filter, wherein the control circuitry is configured to dynamically determine a low band frequency range associated with the low band channel and a high band frequency range associated with the high band channel, and dynamically adjust the tunable low pass filter and the tunable high pass filter based on the low band frequency range and the high band frequency range.

Aspect 7. The wireless communication apparatus of any of Aspects 1 to 6, further comprising control circuitry coupled to the tunable high pass filter and the tunable low pass filter, wherein the control circuitry is configured to dynamically adjust the tunable low pass filter to suppress in-band blocking signals of the second wireless data signal that would interfere with the high band IF signal; and wherein the control circuitry is configured to dynamically adjust the tunable high pass filter to suppress in-band blocking signals of the first wireless data signal that would interfere with the low band IF signal.

Aspect 8. The wireless communication apparatus of any of Aspects 1 to 7, further comprising control circuitry coupled to the tunable high pass filter and the tunable low pass filter, wherein the control circuitry is configured to adjust the tunable low pass filter to generate a threshold signal suppression amount at a threshold frequency gap from an end frequency of the low band channel; and wherein the control circuitry is configured to adjust the tunable high pass filter to generate the threshold signal suppression amount at a threshold frequency distance from an end frequency of the high band channel.

Aspect 9. The wireless communication apparatus of any of Aspects 1 to 8, wherein the threshold signal suppression amount is 30 decibels (dB), and wherein the threshold frequency distance is 2 gigahertz (GHz).

Aspect 10. The wireless communication apparatus of any of Aspects 1 to 9, wherein the end frequency of the low band channel is configurable from a frequency of 8.8 GHz to a frequency of 10 GHz.

Aspect 11. The wireless communication apparatus of any of Aspects 1 to 10, wherein the end frequency of the high band channel is configurable from a frequency of 10.8 GHz to a frequency of 12 GHz.

Aspect 12. The wireless communication apparatus of any of Aspects 1 to 11, wherein the end frequency of the high band channel of the CA system is configurable in a first range of frequencies, and wherein the end frequency of the low band channel of the CA system is configurable in a second range of frequencies, wherein the first range of frequencies overlaps with the second range of frequencies.

Aspect 13. The wireless communication apparatus of any of Aspects 1 to 12, further comprising: modem circuitry coupled to the IF integrated circuit, wherein the IF integrated circuit is configured to separate the low band IF signal and the high band IF signal from the merged IF CA signal and downconvert the low band IF signal and the high band IF signal to corresponding baseband frequencies for communication to the modem circuitry.

Aspect 14. The wireless communication apparatus of any of Aspects 1 to 13, further comprising: a first signal path and a second signal path for receiving corresponding wireless signals for beamforming; wherein the high band mmW CA receive port, the low band mmW CA receive port, the high band mixer, the tunable high pass filter, the IF received signal multiplexer, the low band mixer, and the tunable low pass filter are structured as part of the first signal path.

Aspect 15. The wireless communication apparatus of any of Aspects 1 to 14, wherein the second signal path includes: a second high band mmW CA receive port; a second high band mixer including an RF receive signal input, a local oscillator (LO) input, and an IF signal output, wherein the RF receive signal input is coupled to the second high band mmW CA receive port; a second tunable high pass filter including an input and an output, wherein the second input is coupled to the IF signal output of the second high band mixer; a second IF received signal multiplexer including a merged IF CA signal output, a first input, and a second input, wherein the first input is coupled to the output of the second tunable high pass filter; a second low band mmW CA receive port; a second low band mixer including an RF receive signal input, an LO input, and an IF signal output, wherein the RF receive signal input is coupled to the second low band mmW CA receive port; and a second tunable low pass filter including an input and an output, wherein the input is coupled to the IF signal output of the second low band mixer, and wherein the output is coupled to the second input of the second IF received signal multiplexer.

Aspect 16. The wireless communication apparatus of any of Aspects 1 to 15, further comprising a high band antenna coupled to the high band mmW CA receive port; a low band antenna coupled to the low band mmW CA receive port; control circuitry coupled to the tunable high pass filter and the tunable low pass filter; and a display coupled to the control circuitry.

Aspect 17. A wireless communication apparatus, comprising: a high band millimeter wave (mmW) carrier aggregation (CA) receive port; a high band mixer coupled to the high band mmW CA receive port; a tunable high pass filter coupled to the high band mixer; a low band mmW CA receive port; a low band mixer couple to the low band mmW CA receive port; a tunable low pass filter coupled to the low band mixer; and an intermediate frequency (IF) received signal multiplexer including a first input coupled to the tunable high pass filter, a second input coupled to the tunable low pass filter, and a merged IF CA signal output.

Aspect 18. The wireless communication apparatus of Aspect 17, further comprising: a mmW transmission path coupled to an output of the IF received signal multiplexer.

Aspect 19. The wireless communication apparatus of any of Aspects 17 to 18, further comprising: an IF integrated circuit; wherein the high band mixer, the tunable high pass filter, the IF received signal multiplexer, the low band mixer, and the tunable low pass filter are structured as part of an RF integrated circuit; and wherein the mmW transmission path couples the merged IF CA signal output of the IF received signal multiplexer to the IF integrated circuit.

Aspect 20. The wireless communication apparatus of any of Aspects 17 to 19, wherein the high band mmW CA receive port is configured to receive a first wireless data signal in a high band channel of a CA system; wherein the low band mmW CA receive port is configured to receive a second wireless data signal in a low band channel of the CA system; wherein the high band mixer is configured to downconvert the first wireless data signal to a high band IF signal using an LO signal; wherein the low band mixer is configured to downconvert the second wireless data signal to a low band IF signal using the LO signal; wherein the IF received signal multiplexer is configured to merge the low band IF signal and the high band IF signal into a merged IF CA signal for transmission to the IF integrated circuit via the mmW transmission path.

Aspect 21. The wireless communication apparatus of any of Aspects 17 to 20, further comprising: modem circuitry coupled to the IF integrated circuit, wherein the IF integrated circuit is configured to separate a low band IF signal and a high band IF signal from the merged IF CA signal and downconvert the low band IF signal and the high band IF signal to corresponding baseband frequencies for communication to the modem circuitry.

Aspect 22. The wireless communication apparatus of any of Aspects 17 to 21, further comprising control circuitry coupled to the tunable high pass filter and the tunable low pass filter, wherein the control circuitry is configured to dynamically determine a low band frequency range associated with the low band mmW CA receive port and a high band frequency range associated with the high band mmW CA receive port, and dynamically adjust the tunable low pass filter and the tunable high pass filter based on the low band frequency range and the high band frequency range.

Aspect 23. The wireless communication apparatus of any of Aspects 17 to 22, further comprising control circuitry coupled to the tunable high pass filter and the tunable low pass filter, wherein the control circuitry is configured to adjust the tunable low pass filter to generate a threshold signal suppression amount at a threshold frequency gap from an end frequency of a low band channel; and wherein the control circuitry is configured to adjust the tunable high pass filter to generate the threshold signal suppression amount at a threshold frequency distance from an end frequency of a high band channel.

Aspect 24. The wireless communication apparatus of any of Aspects 17 to 23, wherein the end frequency of the high band channel is configurable in a first range of frequencies, and wherein the end frequency of the low band channel is configurable in a second range of frequencies, wherein the first range of frequencies overlaps with the second range of frequencies.

Aspect 25. The wireless communication apparatus of any of Aspects 17 to 24, further comprising: a first signal path and a second signal path for receiving corresponding wireless signals for beamforming; wherein the high band mmW CA receive port, the low band mmW CA receive port, the high band mixer, the tunable high pass filter, the IF received signal multiplexer, the low band mixer, and the tunable low pass filter are structured as part of the first signal path.

Aspect 26. The wireless communication apparatus of any of Aspects 17 to 25, wherein the second signal path includes: a second high band mmW CA receive port; a second high band mixer coupled to the second high band mmW CA receive port; a second tunable high pass filter coupled to an output of the second high band mixer; a second IF received signal multiplexer coupled to the second tunable high pass filter; a second low band mmW CA receive port; a second low band mixer coupled to the second low band mmW CA receive port; and a second tunable low pass filter coupled to the second low band mixer, wherein an output of the second tunable low pass filter is coupled to the second IF received signal multiplexer.

Aspect 27. The wireless communication apparatus of any of Aspects 17 to 26, further comprising a high band antenna coupled to the high band mmW CA receive port; a low band antenna coupled to the low band mmW CA receive port; control circuitry coupled to the tunable high pass filter and the tunable low pass filter; and a display coupled to the control circuitry.

Aspect 28. A method comprising: receiving, at a high band millimeter wave (mmW) carrier aggregation (CA) receive port, a first wireless data signal; downconverting the first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal; filtering the high band IF signal using a tunable high pass filter, the tunable high pass filter including an input and an output, wherein the input is coupled to the IF signal output of the high band mixer; receiving a second wireless data signal at a low band mmW CA receive port; downconverting the second wireless data signal to a low band IF signal using a low band mixer including an RF receive signal input, an LO input, and an IF signal output, wherein the RF receive signal input is coupled to the low band mmW CA receive port to receive the second wireless data signal; filtering the low band IF signal using a tunable low pass filter, the tunable low pass filter including an input and an output, wherein the input is coupled to the IF signal output of the low band mixer, and wherein the output is coupled to the second input of the IF received signal multiplexer; and multiplexing the high band IF signal and the low band IF signal to generate a merged IF CA signal using an IF received signal multiplexer, the IF received signal multiplexer including a merged IF CA signal output, a first input, and a second input, wherein the first input is coupled to the output of the tunable high pass filter to receive the high band IF signal, and wherein the second input is coupled to the output of the tunable low pass filter to receive the low band IF signal.

Aspect 29. The method of Aspect 28, further comprising: receiving the first wireless data signal at a first antenna of a computing device, wherein the first antenna is coupled to the high band mmW CA receive port; and receiving the second wireless data signal at a second antenna of the computing device, wherein the second antenna is coupled to the low band mmW CA receive port.

Aspect 30. The method of any of Aspects 28 to 29, further comprising: providing the merged IF CA signal to an IF integrated circuit, wherein the IF integrated circuit is configured to separate the low band IF signal and the high band IF signal from the merged IF CA signal and downconvert the low band IF signal and the high band IF signal to corresponding baseband frequencies for communication to modem circuitry.

Aspect 31: A non-transitory computer readable storage medium comprising instructions that, when executed by processing circuitry of a device, cause the device to perform operations in accordance with any aspect above.

Aspect 32. A device comprising means for performing operations in accordance with any aspect above.

Aspect 33. The device of aspect 32 comprising elements of any device in accordance with aspects described above.

What is claimed is:

1. A wireless communication apparatus, comprising:
   a high band millimeter wave (mmW) carrier aggregation (CA) receive port;
   a high band mixer including a radio frequency (RF) receive signal input, a local oscillator (LO) input, and an IF signal output, wherein the RF receive signal input is coupled to the high band mmW CA receive port;
   a tunable high pass filter including an input and an output, wherein the input is coupled to the IF signal output of the high band mixer;
   an intermediate frequency (IF) received signal multiplexer including a merged IF CA signal output, a first input, and a second input, wherein the first input is coupled to the output of the tunable high pass filter;
   a low band mmW CA receive port;
   a low band mixer including an RF receive signal input, an LO input, and an IF signal output, wherein the RF receive signal input of the low band mixer is coupled to the low band mmW CA receive port; and
   a tunable low pass filter including an input and an output, wherein the input is coupled to the IF signal output of the low band mixer, and wherein the output is coupled to the second input of the IF received signal multiplexer.

2. The wireless communication apparatus of claim 1, further comprising:
   a mmW transmission path coupled to the output of the IF received signal multiplexer.

3. The wireless communication apparatus of claim 2, further comprising:
   an IF integrated circuit;
   wherein the high band mixer, the tunable high pass filter, the IF received signal multiplexer, the low band mixer, and the tunable low pass filter are structured as part of an RF integrated circuit; and
   wherein the mmW transmission path couples the merged IF CA signal output of the IF received signal multiplexer to the IF integrated circuit.

4. The wireless communication apparatus of claim 3, wherein the high band mmW CA receive port is configured to receive a first wireless data signal in a high band channel of a CA system; and
   wherein the low band mmW CA receive port is configured to receive a second wireless data signal in a low band channel of the CA system.

5. The wireless communication apparatus of claim 4, wherein the high band mixer is configured to downconvert the first wireless data signal to a high band IF signal using an LO signal;
   wherein the low band mixer is configured to downconvert the second wireless data signal to a low band IF signal using the LO signal; and
   wherein the IF received signal multiplexer is configured to merge the low band IF signal and the high band IF signal into a merged IF CA signal for transmission to the IF integrated circuit via the mmW transmission path.

6. The wireless communication apparatus of claim 5, further comprising control circuitry coupled to the tunable high pass filter and the tunable low pass filter, wherein the control circuitry is configured to dynamically determine a low band frequency range associated with the low band channel and a high band frequency range associated with the high band channel, and dynamically adjust the tunable low pass filter and the tunable high pass filter based on the low band frequency range and the high band frequency range.

7. The wireless communication apparatus of claim 5, further comprising control circuitry coupled to the tunable high pass filter and the tunable low pass filter, wherein the control circuitry is configured to dynamically adjust the tunable low pass filter to suppress in-band blocking signals of the second wireless data signal that would interfere with the high band IF signal; and
   wherein the control circuitry is configured to dynamically adjust the tunable high pass filter to suppress in-band blocking signals of the first wireless data signal that would interfere with the low band IF signal.

8. The wireless communication apparatus of claim 5, further comprising control circuitry coupled to the tunable high pass filter and the tunable low pass filter, wherein the control circuitry is configured to adjust the tunable low pass filter to generate a threshold signal suppression amount at a threshold frequency gap from an end frequency of the low band channel; and
   wherein the control circuitry is configured to adjust the tunable high pass filter to generate the threshold signal suppression amount at a threshold frequency distance from an end frequency of the high band channel.

9. The wireless communication apparatus of claim 8, wherein the threshold signal suppression amount is 30 decibels (dB), and wherein the threshold frequency distance is 2 gigahertz (GHz).

10. The wireless communication apparatus of claim 8, wherein the end frequency of the low band channel is configurable from a frequency of 8.8 GHz to a frequency of 10 GHz.

11. The wireless communication apparatus of claim 8, wherein the end frequency of the high band channel is configurable from a frequency of 10.8 GHz to a frequency of 12 GHz.

12. The wireless communication apparatus of claim 8, wherein the end frequency of the high band channel of the CA system is configurable in a first range of frequencies, and wherein the end frequency of the low band channel of the CA system is configurable in a second range of frequencies, wherein the first range of frequencies overlaps with the second range of frequencies.

13. The wireless communication apparatus of claim 5, further comprising:
   modem circuitry coupled to the IF integrated circuit, wherein the IF integrated circuit is configured to separate the low band IF signal and the high band IF signal from the merged IF CA signal and downconvert the low band IF signal and the high band IF signal to corresponding baseband frequencies for communication to the modem circuitry.

14. The wireless communication apparatus of claim 1, further comprising:
   a first signal path and a second signal path for receiving corresponding wireless signals for beamforming;
   wherein the high band mmW CA receive port, the low band mmW CA receive port, the high band mixer, the tunable high pass filter, the IF received signal multiplexer, the low band mixer, and the tunable low pass filter are structured as part of the first signal path.

15. The wireless communication apparatus of claim 14, wherein the second signal path includes:
   a second high band mmW CA receive port;
   a second high band mixer including an RF receive signal input, a local oscillator (LO) input, and an IF signal output, wherein the RF receive signal input is coupled to the second high band mmW CA receive port;
   a second tunable high pass filter including an input and an output, wherein the second input is coupled to the IF signal output of the second high band mixer;
   a second IF received signal multiplexer including a merged IF CA signal output, a first input, and a second input, wherein the first input of the second IF received signal multiplexer is coupled to the output of the second tunable high pass filter;
   a second low band mmW CA receive port;
   a second low band mixer including an RF receive signal input, an LO input, and an IF signal output, wherein the RF receive signal input of the second low band mixer is coupled to the second low band mmW CA receive port; and
   a second tunable low pass filter including an input and an output, wherein the input is coupled to the IF signal output of the second low band mixer, and wherein the output is coupled to the second input of the second IF received signal multiplexer.

16. The wireless communication apparatus of claim 1, further comprising a high band antenna coupled to the high band mmW CA receive port;
   a low band antenna coupled to the low band mmW CA receive port;
   control circuitry coupled to the tunable high pass filter and the tunable low pass filter; and
   a display coupled to the control circuitry.

17. A wireless communication apparatus, comprising:
   a high band millimeter wave (mmW) carrier aggregation (CA) receive port;
   a high band mixer coupled to the high band mmW CA receive port;
   a tunable high pass filter coupled to the high band mixer;
   a low band mmW CA receive port;
   a low band mixer coupled to the low band mmW CA receive port;
   a tunable low pass filter coupled to the low band mixer; and an intermediate frequency (IF) received signal multiplexer including a first input coupled to the tunable high pass filter, a second input coupled to the tunable low pass filter, and a merged IF CA signal output.

18. The wireless communication apparatus of claim 17, further comprising:
a mmW transmission path coupled to an output of the IF received signal multiplexer.

19. The wireless communication apparatus of claim 18, further comprising:
an IF integrated circuit;
wherein the high band mixer, the tunable high pass filter, the IF received signal multiplexer, the low band mixer, and the tunable low pass filter are structured as part of an RF integrated circuit; and
wherein the mmW transmission path couples the merged IF CA signal output of the IF received signal multiplexer to the IF integrated circuit.

20. The wireless communication apparatus of claim 19, wherein the high band mmW CA receive port is configured to receive a first wireless data signal in a high band channel of a CA system;
wherein the low band mmW CA receive port is configured to receive a second wireless data signal in a low band channel of the CA system;
wherein the high band mixer is configured to downconvert the first wireless data signal to a high band IF signal using an LO signal;
wherein the low band mixer is configured to downconvert the second wireless data signal to a low band IF signal using the LO signal;
wherein the IF received signal multiplexer is configured to merge the low band IF signal and the high band IF signal into a merged IF CA signal for transmission to the IF integrated circuit via the mmW transmission path.

21. The wireless communication apparatus of claim 19, further comprising:
modem circuitry coupled to the IF integrated circuit, wherein the IF integrated circuit is configured to separate a low band IF signal and a high band IF signal from the merged IF CA signal and downconvert the low band IF signal and the high band IF signal to corresponding baseband frequencies for communication to the modem circuitry.

22. The wireless communication apparatus of claim 17, further comprising control circuitry coupled to the tunable high pass filter and the tunable low pass filter, wherein the control circuitry is configured to dynamically determine a low band frequency range associated with the low band mmW CA receive port and a high band frequency range associated with the high band mmW CA receive port, and dynamically adjust the tunable low pass filter and the tunable high pass filter based on the low band frequency range and the high band frequency range.

23. The wireless communication apparatus of claim 17, further comprising control circuitry coupled to the tunable high pass filter and the tunable low pass filter, wherein the control circuitry is configured to adjust the tunable low pass filter to generate a threshold signal suppression amount at a threshold frequency gap from an end frequency of a low band channel; and
wherein the control circuitry is configured to adjust the tunable high pass filter to generate the threshold signal suppression amount at a threshold frequency distance from an end frequency of a high band channel.

24. The wireless communication apparatus of claim 23, wherein the end frequency of the high band channel is configurable in a first range of frequencies, and wherein the end frequency of the low band channel is configurable in a second range of frequencies, wherein the first range of frequencies overlaps with the second range of frequencies.

25. The wireless communication apparatus of claim 17, further comprising:
a first signal path and a second signal path for receiving corresponding wireless signals for beamforming;
wherein the high band mmW CA receive port, the low band mmW CA receive port, the high band mixer, the tunable high pass filter, the IF received signal multiplexer, the low band mixer, and the tunable low pass filter are structured as part of the first signal path.

26. The wireless communication apparatus of claim 25, wherein the second signal path includes:
a second high band mmW CA receive port;
a second high band mixer coupled to the second high band mmW CA receive port;
a second tunable high pass filter coupled to an output of the second high band mixer;
a second IF received signal multiplexer coupled to the second tunable high pass filter;
a second low band mmW CA receive port;
a second low band mixer coupled to the second low band mmW CA receive port; and
a second tunable low pass filter coupled to the second low band mixer, wherein an output of the second tunable low pass filter is coupled to the second IF received signal multiplexer.

27. The wireless communication apparatus of claim 17, further comprising a high band antenna coupled to the high band mmW CA receive port;
a low band antenna coupled to the low band mmW CA receive port;
control circuitry coupled to the tunable high pass filter and the tunable low pass filter; and
a display coupled to the control circuitry.

28. A method comprising:
receiving, at a high band millimeter wave (mmW) carrier aggregation (CA) receive port, a first wireless data signal;
downconverting the first wireless data signal to a high band intermediate frequency (IF) signal using a high band mixer, the high band mixer including a radio frequency (RF) receive signal input, a local oscillator (LO) input, and an IF signal output, wherein the RF receive signal input is coupled to the high band mmW CA receive port to receive the first wireless data signal;
filtering the high band IF signal using a tunable high pass filter, the tunable high pass filter including an input and an output, wherein the input is coupled to the IF signal output of the high band mixer;
receiving a second wireless data signal at a low band mmW CA receive port;
downconverting the second wireless data signal to a low band IF signal using a low band mixer including an RF receive signal input, an LO input, and an IF signal output, wherein the RF receive signal input of the low band mixer is coupled to the low band mmW CA receive port to receive the second wireless data signal;
filtering the low band IF signal using a tunable low pass filter, the tunable low pass filter including an input and an output, wherein the input is coupled to the IF signal output of the low band mixer, and wherein the output is coupled to a second input of the IF received signal multiplexer; and multiplexing the high band IF signal and the low band IF signal to generate a merged IF CA signal using an IF received signal multiplexer, the IF received signal multiplexer including a merged IF CA signal output, a first input, and the second input, wherein the first input is coupled to the output of the tunable high pass filter to receive the high band IF signal, and wherein the second input is coupled to the output of the tunable low pass filter to receive the low band IF signal.

29. The method of claim 28, further comprising:

receiving the first wireless data signal at a first antenna of a computing device, wherein the first antenna is coupled to the high band mmW CA receive port; and receiving the second wireless data signal at a second antenna of the computing device, wherein the second antenna is coupled to the low band mmW CA receive port.

30. The method of claim 29, further comprising:

providing the merged IF CA signal to an IF integrated circuit, wherein the IF integrated circuit is configured to separate the low band IF signal and the high band IF signal from the merged IF CA signal and downconvert the low band IF signal and the high band IF signal to corresponding baseband frequencies for communication to modem circuitry.

\* \* \* \* \*